United States Patent [19]
Guterman et al.

[11] Patent Number: 5,883,409
[45] Date of Patent: Mar. 16, 1999

[54] EEPROM WITH SPLIT GATE SOURCE SIDE INJECTION

[75] Inventors: Daniel C. Guterman, Fremont; Gheorghe Samachisa, San Jose; Yupin Kawing Fong, Fremont; Eliyahou Harari, Los Gatos, all of Calif.

[73] Assignee: Sandisk Corporation, Sunnyvale, Calif.

[21] Appl. No.: 908,744

[22] Filed: Aug. 7, 1997

Related U.S. Application Data

[60] Division of Ser. No. 607,951, Feb. 28, 1996, Pat. No. 5,712,180, which is a continuation-in-part of Ser. No. 193,707, Feb. 9, 1994, Pat. No. 5,776,810, which is a division of Ser. No. 820,364, Jan. 14, 1992, Pat. No. 5,313,421.

[51] Int. Cl.$^6$ ................................................. H01L 29/788
[52] U.S. Cl. ........................................... 257/316; 257/326
[58] Field of Search ..................................... 257/314, 315, 257/316, 319, 321, 322, 326; 438/258

[56] References Cited

U.S. PATENT DOCUMENTS

| | | | |
|---|---|---|---|
| Re. 32,401 | 4/1987 | Beilstein, Jr. et al. | 365/182 |
| 4,151,020 | 4/1979 | McElroy | 148/187 |
| 4,151,021 | 4/1979 | McElroy | 148/187 |

(List continued on next page.)

FOREIGN PATENT DOCUMENTS

| | | |
|---|---|---|
| 0373830 | 6/1990 | European Pat. Off. . |
| 61-181168 | 8/1986 | Japan . |
| 1-304784 | 12/1989 | Japan . |
| 2-360 | 1/1990 | Japan . |

OTHER PUBLICATIONS

K. Naruke et al., "A New Flash–Erase EEPROM Cell with A Sidewall Select–Gate On Its Source Side", IEDM 89–603, IEEE (1989), pp. 603–606.

M. Kamiya et al., "EPROM Cell with High Gate Injection Efficiency", IEDM 82–741, IEEE (1982), pp. 741–744.

J. Van Houdt, et al., "A 5–Volt–Only Fast–Programmable Flash EEPROM Cell with A Double Polysilicon Split–Gate Structure", Interuniversity Microelectronics Center (Feb. 1991).

(List continued on next page.)

*Primary Examiner*—David B. Hardy
*Attorney, Agent, or Firm*—Steven F. Caserza; Flehr Hohbach Test Albritton & Herbert LLP

[57] ABSTRACT

Novel memory cells utilize source-side injection, allowing very small programming currents. If desired, to-be-programmed cells are programmed simultaneously while not requiring an unacceptably large programming current for any given programming operation. In one embodiment, memory arrays are organized in sectors with each sector being formed of a single column or a group of columns having their control gates connected in common. In one embodiment, a high speed shift register is used in place of a row decoder to serially shift in data for the word lines, with all data for each word line of a sector being contained in the shift register on completion of its serial loading. In one embodiment, speed is improved by utilizing a parallel loaded buffer register which receives parallel data from the high speed shift register and holds that data during the write operation, allowing the shift register to receive serial loaded data during the write operation for use in a subsequent write operation. In one embodiment, a verification is performed in parallel on all to-be-programmed cells in a column and the bit line current monitored. If all of the to-be-programmed cells have been properly programmed, the bit line current will be substantially zero. If bit line current is detected, another write operation is performed on all cells of the sector, and another verify operation is performed. This write/verify procedure is repeated until verification is successful, as detected or substantially zero, bit line current.

34 Claims, 24 Drawing Sheets

U.S. PATENT DOCUMENTS

| | | | |
|---|---|---|---|
| 4,184,207 | 1/1980 | McElroy | 365/185 |
| 4,202,044 | 5/1980 | Beilstein, Jr. et al. | 365/182 |
| 4,271,421 | 6/1981 | McElroy | 357/41 |
| 4,302,766 | 11/1981 | Guterman et al. | 357/41 |
| 4,331,968 | 5/1982 | Gosney, Jr. et al. | 357/23 |
| 4,380,057 | 4/1983 | Kotecha et al. | 365/185 |
| 4,456,971 | 6/1984 | Fukuda et al. | 364/900 |
| 4,462,090 | 7/1984 | Iizuka | 365/185 |
| 4,488,265 | 12/1984 | Kotecha | 365/189 |
| 4,561,004 | 12/1985 | Kuo et al. | 357/23.5 |
| 4,583,201 | 4/1986 | Bertin et al. | 365/104 |
| 4,622,656 | 11/1986 | Kamiya et al. | 365/185 |
| 4,652,897 | 3/1987 | Okuyama et al. | 357/23.5 |
| 4,794,565 | 12/1988 | Wu et al. | 365/185 |
| 4,803,529 | 2/1989 | Masuoka | 357/23.5 |
| 4,805,142 | 2/1989 | Bertin et al. | 365/100 |
| 4,811,294 | 3/1989 | Kobayashi et al. | 365/189 |
| 4,821,236 | 4/1989 | Hayashi et al. | 365/185 |
| 4,943,962 | 7/1990 | Imamiya et al. | 365/230.08 |
| 4,990,979 | 2/1991 | Otto | 257/316 |
| 5,028,553 | 7/1991 | Esquivel et al. | 437/43 |
| 5,029,130 | 7/1991 | Yeh | 365/185 |
| 5,045,488 | 9/1991 | Yeh | 437/43 |
| 5,057,886 | 10/1991 | Riemenschneider et al. | 357/23.5 |
| 5,067,108 | 11/1991 | Jenq | 365/185 |
| 5,070,032 | 12/1991 | Yuan et al. | 437/43 |
| 5,081,054 | 1/1992 | Wu et al. | 437/43 |
| 5,081,056 | 1/1992 | Mazzali et al. | 437/43 |
| 5,095,344 | 3/1992 | Harari | 357/23.5 |
| 5,147,816 | 9/1992 | Gill et al. | 437/52 |
| 5,172,338 | 12/1992 | Mehrotra et al. | 365/185 |
| 5,204,841 | 4/1993 | Chappell et al. | 365/230.05 |
| 5,225,361 | 7/1993 | Kakiuchi et al. | 437/43 |
| 5,247,485 | 9/1993 | Ide | 365/230.01 |
| 5,264,384 | 11/1993 | Kaya et al. | 437/43 |
| 5,278,439 | 1/1994 | Ma et al. | 257/319 |
| 5,280,446 | 1/1994 | Ma et al. | 365/185 |
| 5,284,784 | 2/1994 | Manley | 437/43 |
| 5,297,148 | 3/1994 | Harari et al. | 371/10.2 |
| 5,313,421 | 5/1994 | Guterman et al. | 365/185 |
| 5,323,355 | 6/1994 | Kato | 365/230.01 |
| 5,355,347 | 10/1994 | Cioaca | 365/230.08 |
| 5,378,643 | 1/1995 | Ajika et al. | 437/43 |
| 5,396,468 | 3/1995 | Harari et al. | 365/218 |
| 5,412,600 | 5/1995 | Nakajima | 257/314 |
| 5,606,521 | 2/1997 | Kuo et al. | 365/149 |
| 5,656,840 | 8/1997 | Yang | 257/321 |
| 5,708,285 | 1/1998 | Otani et al. | 257/321 |

OTHER PUBLICATIONS

Yale Ma, et al. "A Dual–bit Split–Gate EEPROM (DSG) Cell in Contactless Array for Single–Vcc High Density Flash Memories", IEDM 94–57, IEEE (1994), pp. 57–60.

G.S. Alberts et al., "Multi–Bit Storage FET EAROM Cell", G.S. *IBM Technical Disclosure Bulletin,* vol. 24, No. 7A (Dec. 1981), pp. 3311–3314.

Takeshi Nakayama, "A 5–V–Only One–Transistor 256K EEPROM with Page–Mode Erase", IEEE (Aug. 1989), vol. 24, No. 4, pp. 911–915.

Mike McConnell, et al., "An Experimental 4–Mb Flash EEPROM with Sector Erase", IEEE (Apr. 1991), vol. 26, No. 4, pp. 484–489.

Masaki Momodomi, et al., "A 4–Mb Nand EEPROM with Tight Programmed $V_t$ Distribution", IEEE (Apr. 1991), vol. 26, No. 4., pp. 492–495.

Fujio Masuoka, et al., "A 256–kbit Flash $E^2$PROM Using Triple–Polysilicon Technology", IEEE (Aug. 1987), vol. SC–22, No. 4, pp. 548–552.

Dumitru Cioaca, et al., "A Million–Cycle 256K EEPROM", IEEE (Oct. 1987), vol. SC–22, No. 5, pp. 684–692.

Cristiano Calligaro, et al., "A New Serial Sensing Approach for Multistorage Non–Volatile Memories", IEEE (1995), pp. 21–26.

Min–hwa Chi, et al., "Multi–level Flash/EPROM Memories: New Self–convergent Programming Methods for Low–voltage Applications", IEDM 95–271, IEEE (1995), pp. 271–274.

EEPROM WITH SPLIT GATE SOURCE SIDE INJECTION

RELATED APPLICATIONS

This application is a division of U.S. application Ser. No. 08/607,951, filed Feb. 28, 1996, now U.S. Pat. No. 5,712,180, which in turn is a continuation-in-part application of U.S. Ser. No. 08/193,707, filed Feb. 9, 1994, now U.S. Pat. No. 5,776,810, which in turn is a division of U.S. application Ser. No. 07/820,364, filed Jan. 14, 1992 (now U.S. Pat. No. 5,313,421).

TECHNICAL FIELD

This invention pertains to semiconductor memory cells and arrays, more particularly to electrically erasable programmable read only memories.

BACKGROUND

Erasable programmable read only memories (EPROMs) and electrically erasable programmable read only (EEPROMs) are well known in the art. These devices have the ability to store data in non-volatile fashion, while also being capable of being erased and rewritten as desired. EPROM devices are typically erased by exposing the integrated circuit device to ultraviolet radiation, while EEPROMs allow erasure to be performed electrically.

One form of EEPROM device includes a so-called "split-gate" electrode, in which the control gate includes a first portion overlaying a floating gate and a second portion directly overlaying the channel. Such a split gate structure is described in a 5-Volt-Only Fast-Programmable Flash EEPROM Cell with a Double Polysilicon Split-Gate Structure by J. Van Houdt et al, Eleventh IEEE Non-Volatile Semiconductor Workshop, February 1991, in which charge is injected into the floating gate from the source side of the cell. U.S. Pat. No. 4,652,897 describes an EEPROM device which does not utilize a split-gate, but which also provides injection to the floating gate from the source side of the device.

As described in the above referenced U.S. Pat. No. 4,652,897, memory cells are typically arranged in an array, as is well known in the art. One form of such an array utilizes buried diffusions, in which source and array regions are covered with a fairly thick layer of insulating material. This is shown for example, in U.S. Pat. Nos. 4,151,020; 4,151,021; 4,184,207; and 4,271,421. Such buried diffusion devices often utilize a virtual ground approach, in which columns connecting the sources of a first column of memory cells also serves to connect drains of an adjacent column of memory cells.

While many EEPROM devices utilize two layers of polycrystalline silicon, one for the formation of the floating gate, and the other for the formation of the control gate and possibly electrical interconnects, other EEPROM devices utilize three layers of polycrystalline silicon. For example, U.S. Pat. No. 4,302,766 provides a first polycrystalline silicon layer for the floating gate, a second polycrystalline silicon layer for the control gate, and a third polycrystalline silicon layer coupled through an erase window to a portion of the first polycrystalline silicon layer for use during erasure of the cell. U.S. Pat. No. 4,331,968 also uses a third layer of polycrystalline silicon to form an erase gate, while U.S. Pat. No. 4,462,090 forms an addressing gate electrode utilizing a third layer of polycrystalline silicon. U.S. Pat. Nos. 4,561,004 and 4,803,529 also use three layers of polycrystalline silicon in their own specific configurations. Japanese Patent Publication 61-181168 appears to utilize three layers of polycrystalline silicon to provide additional capacitive coupling to the floating gate. Japanese Patent Publication 63-265391 appears to pertain to a buried diffusion array, possibly utilizing virtual grounds.

European Patent Application 0373830 describes an EEPROM in which two polycrystalline silicon layers are used, with the second layer of polycrystalline silicon having two pieces, one of which provides the erase function, and one of which provides the steering function. "A New Flash-Erase EEPROM Cell With a Sidewall Select-Gate on its Source Side" by K. Naruke et al. IEDM-89-603 and U.S. Pat. No. 4,794,565 describe an EEPROM utilizing a side wall select gate located on the source side of the field effect transistor.

"EPROM Cell With High Gate Injection Efficiency" by M. Kamiya et al. IEDM 82-741, and U.S. Pat. No. 4,622,656 describe an EEPROM device in which a reduced programming voltage is provided by having a highly doped channel region under the select gate, and the channel region under the floating gate being either lightly doped or doped to the opposite conductivity type, thereby providing a significant surface potential gap at the transition location of the channel.

In recent years there has been significant interest in producing high capacity FLASH memory devices which use split-gate, source-side hot electron programming, in place of the more conventional drain-side channel hot electron (CHE) mechanism.

The reasons for this include its inherently lower write power requirement (1/10th that of CHE or less), facilitating low voltage operation and higher write speeds via increased parallelism. In addition, the split gate structure is not susceptible to "overerase" related problems (a problem for single gate FLASH memories such as ETOX), and does not experience programming difficulty due to strong overerase, which can hinder programming after an erasure operation in split-gate CHE programming devices.

In view of these benefits, Sandisk Corporation has patented FLASH memory cell and array variants which use source side injection integrated with Sandisk's proprietary thick oxide, poly-to-poly erase tunneling technology, to make a highly scalable, reliable, low power programming cell (D. C. Guterman, G. Samachiasa, Y. Fong and E. Harari, U.S. Pat. No. 5,313,421).

The concept of a multi-bit storage non-volatile cell using a split gate structure was described by G. S. Alberts and H. N. Kotecha (*Multi-bit storage FET EAROM cell*, IBM Technical Disclosure Bulletin, Vol. 24 No. 7A, p. 3311, December 1981). They describe a two-poly, three transistor element-in-series cell, in which the center transistor's channel is controlled directly by the poly2 control gate (which also serves as the cell select gate), and each of the two end transistor channels are controlled by corresponding poly1 floating gates, which in turn are capacitively coupled to the control gate, thereby realizing a plurality of bits in the one physical cell structure.

Recently, at the 1994 IEDM, Bright Microelectronics along with Hyundai presented a similar dual-bit split-gate cell, integrated into a contactless, virtual ground array, and using source side injection programming (Y. Y. Ma and K. Chang, U.S. Pat. No. 5,278,439—referred to henceforth as the Ma approach). One structural difference here from the IBM approach is their separation of the capacitively coupling control gates, which are formed in poly2, and the select gate, which is formed in poly3.

In the Ma approach, they use "conventional" negative control gate driven tunneling through an ultra-thin poly1 gate oxide (about 100 Å or less). This erase approach poses some serious limitations. Erase of one of the two storage transistors uses floating gate to drain tunneling through the ultra-thin oxide, accomplished by biasing the drain to 7v and corresponding control gate to −10v. Because both of these lines run perpendicular to the select gate, this forces a block of cells which are to be simultaneously erased (e.g. a sector) to be bit line oriented, as opposed to the more conventional word line (select gate) oriented block; i.e. its sector must be column organized and thus it cannot be row organized. (For example, a sector could be two columns of floating gates straddling a bit line/diffusion, including the right hand floating gates of the left side cells' floating gate pair plus the left hand floating gates of the right side cells.) This leads to the following disadvantages in the Ma implementation:

(1) Limited to column sector architecture; i.e. cannot readily support the higher read performance row oriented sector architecture. (Since here, within a sector, both erase anode and corresponding control gates run perpendicular to row line direction, this precludes the massively parallel "chunk" implementation of the row oriented sector, which can simultaneously access large numbers of cells within that sector).

(2) Requires ultra-thin, approximately 100 Å, tunneling oxide, imposing following limitations:

Scaling limitation associated with pushing the limits of usable oxide thicknesses, plus the additional area needs associated with maintaining adequate coupling requirements, which must combat the inherently high capacitance per unit area of such a thin oxide;

A myriad of potential retention/reliability problems inherent to using ultra-thin oxide, combined with the parasitic band-to-band tunneling/hole injection associated with the high substrate fields adjacent to the diffusion anode; and Negative gate bias requirements on control gate, to limit band-to-band injection problems, impose process and circuit complexity, plus potentially more layout area requirement.

SUMMARY OF THE INVENTION

In accordance with the teachings of this invention, novel memory cells are described utilizing source-side injection. Source-side injection allows programming utilizing very small programming currents. If desired, in accordance with the teachings of this invention, to-be-programmed cells along a column are programmed simultaneously which, due to the small programming current required for each cell, does not require an unacceptably large programming current for any given programming operation. In one embodiment of this invention, the memory arrays are organized in sectors with each sector being formed of a single column or a group of columns having their control gates connected in common. In one embodiment, a high speed shift register is used in place of a row decoder in order to serially shift in the data for the word lines, with all of the data for each word line of a sector being contained in the shift register on completion of its serial loading. In one embodiment, additional speed is achieved by utilizing a parallel loaded buffer register which receives data in parallel from the high speed shift register and holds that data during the write operation, allowing the shift register to receive serial loaded data during the write operation for use in a subsequent write operation. In one embodiment, a verification is performed in parallel on all to-be-programmed cells in a column and the bit line current monitored. If all of the to-be-programmed cells have been properly programmed, the bit line current will be substantially zero. If bit line current is detected, another write operation is performed on all cells of the sector, and another verify operation is performed. This write/verify procedure is repeated until verification is successful, as detected by substantially zero bit line current.

Among the objectives of the novel cells constructed in accordance with this invention are avoidance of programming limitations such as:

1. High Channel Currents (Power) required for Programming.
2. High Drain Voltage Requirements, which increase with increased levels of erasure.
3. Loss of Read Performance associated with an increase in Programming Efficiency via Heavy Channel doping.
4. Program Wearout Associated with Maintaining a High Drain Bias on Cells exposed to this bias, including both those cells targeted for programming and those cells not targeted but still exposed to the voltage.

In an alternative embodiment of this invention, a multi-bit memory cell is taught utilizing a 3-poly, 3 transistor element-in-series cell in which the center transistor's channel is controlled directly by the poly 3 control gate (which serves as both a cell select gate and erase anode) and each of the two end transistor channels are controlled by corresponding poly1 floating gates, which in turn are capacitively coupled to the poly 2 control or steering gates, thereby realizing a plurality of bits in the one physical cell structure.

The multi-bit cell contains two bits per unit memory cell, coming from two floating gate portions, each having their own control gate (which, in the virtual ground array, runs parallel to the bits lines), and sharing one select gate, placed physically between them (which, in the virtual ground array, runs perpendicular to the bit lines). The diffusion BN+ source/drains straddle the two floating gates, on their opposite facing channel edges to those adjacent the select gate/ transfer channel.

Unlike a single floating gate cell, because here the two floating channels lie in a series configuration, the programmed threshold voltage level of each floating gate must be limited in its upper value in order to be readable (similarly to the Toshiba NAND cell). In this way, either floating gate channel can be unconditionally turned on (i.e. independent of its stored state) when appropriate bias is applied to its corresponding control gate, when reading the state of the other floating gate.

BRIEF DESCRIPTION OF THE DRAWINGS

FIG. 2b is a plan view of one embodiment of an array of memory cells constructed utilizing cells depicted in the cross-sectional view FIG. 2a;

FIG. 7b is a cross-sectional view of the embodiment shown in the plan view of FIG. 7a;

DESCRIPTION OF SPECIFIC EMBODIMENTS

Figure 1A:
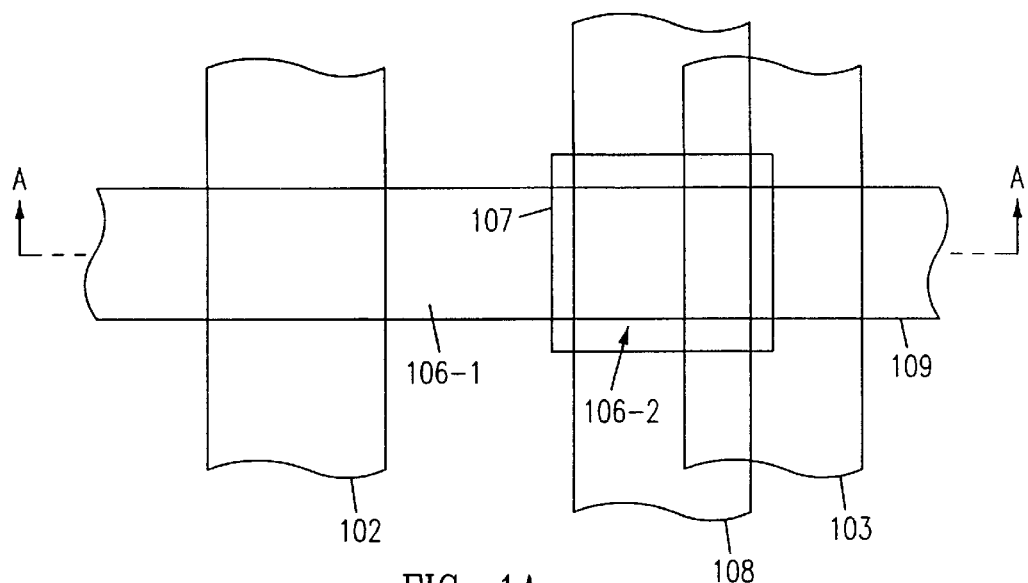
FIGS. 1a, 1b, and 1c, are cell layout, cross-sectional diagram, and equivalent circuit schematic of one embodiment of this invention.
Figure 1B:
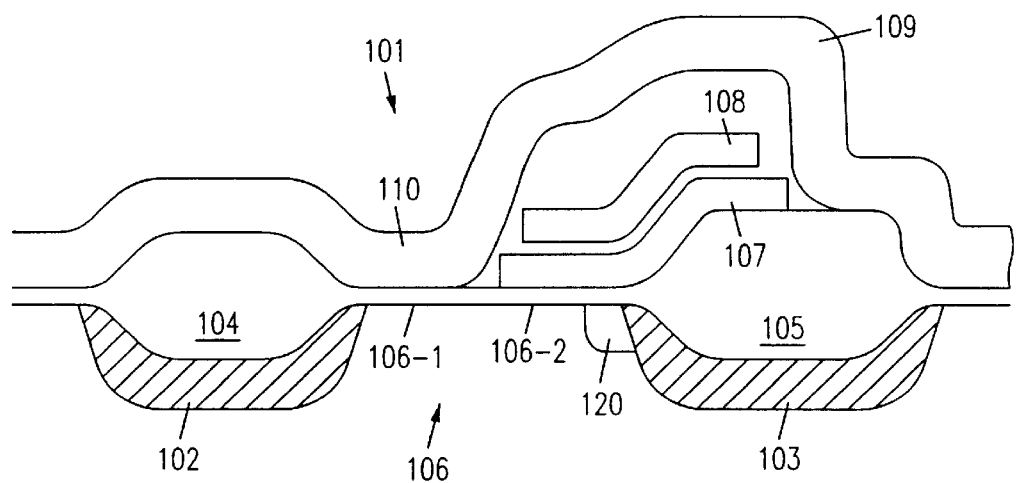
Figure 1C:
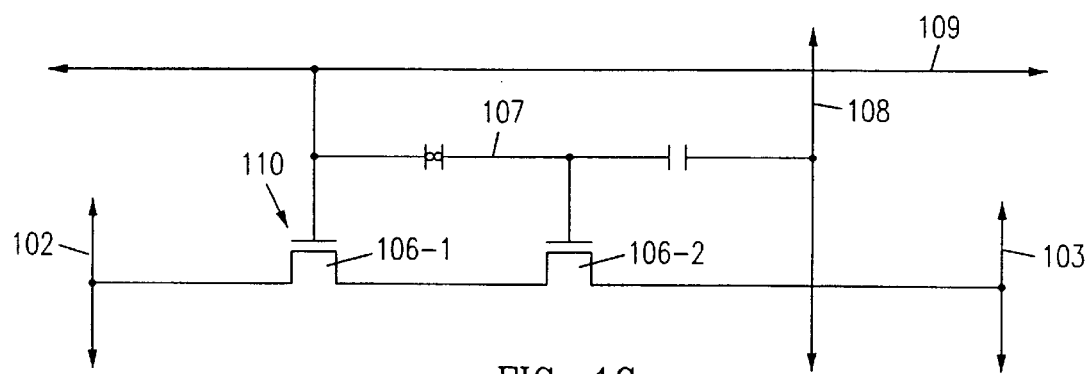

The cell layout, cross-sectional diagram and equivalent circuit schematic of one embodiment are shown in FIGS. 1a, 1b, and 1c, respectively. Similar reference numerals have been used in FIGS. 1a, 1b, and 1c. Referring to the cross-sectional view of FIG. 1b, this embodiment of the novel EEPROM cell, 101, of this invention includes a buried source region 102 and a buried drain region 103, each being buried by a relatively thick layer of dielectric 104 and 105, respectively. Channel region 106 is divided into two portions, a first portion 106-1 which is influenced by the third layer polycrystalline silicon 109 and which forms a select gate, and a second portion 106-2 which is influenced by floating gate 107 formed of a first layer of polycrystalline silicon and which, in turn, is influenced by control gate 108 formed of a second layer polycrystalline silicon. As is well known in the art, suitable dielectric layers such as thermally grown oxide are located between channel 106 and polycrystalline silicon layer 109 and polycrystalline silicon layer 107. Similarly, suitable dielectric layers such as oxide or composite oxide/nitride are formed between the three layers of polycrystalline silicon. Polycrystalline metal silicide can be used in place of one or more of the polycrystalline silicon layers 108 and 109. If desired, a highly-doped P+ region 120 is used within channel 106-2 adjacent buried drain region 103. This region 120 is formed, for example, as a double diffused MOS (DMOS) region in order to establish the threshold voltage $V_t$ of the memory transistor including channel 106-2. This helps to provide a stable threshold voltage, even though the amount of charges trapped in the gate oxide layer in the vicinity of the gap between 106-1 and 106-2 tends to increase with a large number of programming cycles.

An example of operating conditions and levels associated with the embodiment of FIG. 1b are shown in Table 1. High efficiency programming comes about by the ability to simultaneously create a high field region in channel 106-2 under the floating gate, which under the bias conditions of Table 1 occur near the gap between channels 106-1 and 106-2 (see above mentioned IEDM article of Kamiya for theory) while maintaining a low channel/current. Since this high field causes electron injection to floating gate 107 near the source side of channel 106-2, this type of operation is termed "source-side" injection. This mechanism provides high efficiency, low power programming by maintaining a low channel current via word line 109 throttling by using a bias operating near channel threshold, $VT_{p3}$. A major attribute of this type of operation is that it allows for a high drive condition in floating gate channel 106-2 under the floating gate (in fact it thrives on it), offering high-performance read, without degrading programming performance. This is because the very weak drive condition on the select transistor of channel 106-1 is established via the throttling mentioned above to achieve the high fields in the vicinity of the poly 3/poly 1 gap. These fields accelerate the electrons to sufficiently energetic levels (i.e. >3.1 eV) to surmount the $Si/SiO_2$ interface barrier at the source side of floating gate 107. Furthermore, there is a significant vertical component to that field (i.e. normal to the $Si/SiO_2$ surface) driving the electrons up to the surface of channel 106, and thereby assisting the injection into floating gate 107. No read performance penalty is incurred to establish this high field condition. This is in stark contrast to conventional drain side programming, wherein efficient program requires strong channel saturation which shuns high floating gate channel drives, strong overerase, or a weakly turned on series select transistor. These problems with drain side programming dictate high channel currents, care in overerase, potentially high drain voltages, and unfavorable fields (potentially subducting the channel below the surface at the drain side and driving electrons downward away from the floating gate).

Consequently, in accordance with the teachings of this invention, programming efficiencies ($I_G/I_D$) ranging from $10^{-5}$ to $10^{-3}$ are possible, with $I_D$ in the range of 1 mA during programming, which is two to three orders of magnitude smaller than conventional drain side programming. This offers the potential for very fast system level programming by allowing the programming of 100 times as many memory cells in parallel, thereby achieving a 100 fold increase in effective program speed compared with prior art drain side programming.

TABLE 1

State Table & Operating Conditions (FIG. 1b)

| Node Operation | | Poly 3 (Word line) | Poly 2 (Steering Gate) | Drain (BN & Drain) | Source & (BN Source) |
|---|---|---|---|---|---|
| R E A D | STANDBY | 0v | 0v | 1.0v or 0v | 1.0v or 0v |
| | READ SELECTED | 5v | 0v | 1.0v or 0v | 0v or 1.0v |
| | READ UNSELECTED | 5v | 0v | 1.0v | 1.0v |
| E R A S | ERASE UNSELECTED | 5v | 0v | 0v | 0v |

TABLE 1-continued

State Table & Operating Conditions (FIG. 1b)

| Node Operation | | | Poly 3 (Word line) | Poly 2 (Steering Gate) | Drain (BN & Drain) | Source & (BN Source) |
|---|---|---|---|---|---|---|
| E | T | ERASE Option 1 | 5v | −10to−17v | 0v | 0v |
| E | E | or Option 2 | 12–22v | 0v | 0v | 0v |
|   | D |   |   |   |   |   |
| P | R | PROGRAM | H1.5v | 14–20v | 5–7v | 0v |
| R | E | SELECTED |   |   |   |   |
| O | L |   |   |   |   |   |
| G | A |   |   |   |   |   |
| R | T | PROGRAM | 0v | 14–20v | 5–7v | 0v |
| A | E | UNSELECTED | H1.5V | 14–20v | 5–7v | 5–7v |
| M | D |   | 0v | 14–20v | 0v | 0v |

A major feature of the cell of this invention is the decoupling of the select function (in this case poly 3 select transistor 110 in FIG. 1b) from the steering function (poly 2 control gate 108). During programming, this allows the independent control of cell selection/drain current throttling via poly 3 word line 109 bias (biased at slightly higher than $VT_{p3}$) and strong positive voltage coupling onto floating gate 107 (by raising poly 2 control gate 108 to a high voltage, such as about 12 volts). Also, in accordance with the teachings of this invention, the drain voltage can be adjusted independently of steering and select transistor voltage levels, to optimize programming.

During read, the decoupling feature of this invention provides two important advantages, and one exciting side benefit.

1. The ability to set control gate 108 at the optimum voltage level for memory state sensing, i.e. the best balanced reference point for both programmed and erased states. This independence is in contrast to conventional cells wherein the control gate also serves as the select transistor, dictating a voltage level consistent with selection (e.g. Vcc=5v±10%).
2. Improved margin by virtue of being a fixed, (potentially regulated) reference voltage, eliminating the Vcc variation of ±10% inherent to the word line bias levels. (This alone could improve the floating gate memory window by about 0.6v).
3. A side benefit of the ability to independently set the control gate voltage bias discussed above, offers the possibility of a simple way for re-referencing the memory cell for multi-state (i.e. more than conventional 2-state) encoded data. For example if the cell is encoded into three level states, (such as logical 1=strongly erased/high conducting, logical 2=partially programmed/weakly conducting; logical 3=strongly programmed,) then the control gate voltage can be set at two different levels in a two pass read scheme. For example, in the first pass read the control gate voltage would be set at about 0v to discriminate between the logical 1 state and the logical 2/logical 3 states. In the second pass read the control/gate voltage is set to about 2v, to discriminate between the logical 3 state and the logical 1/logical 2 states. By combining the information of this two pass read (e.g. according to Table 2) the original state of the 3 state cell is recovered. This biasing can be done independently of sense amp reference cell considerations allowing a single sense amp/ reference cell circuit to detect the different states via a multi-pass read scheme.

TABLE 2

| READ STATE | PASS 1 [Ref. = 0v] | PASS 2 [Ref. = 2] |
|---|---|---|
| 1 | Hi | Hi |
| 2 | Lo | Hi |
| 3 | Lo | Lo |

The two options for erase operation/bias conditions shown in Table 1 stem from two different sets of considerations. The first option shown brings poly 2 control gate 108 to a large negative voltage, but allows poly 3 word line 109 to remain at a low voltage (e.g. 0v to 5v). This is desirable since the word lines and their decoders are preferably high performance, and repeated many times with a tightly pitched requirement, making high voltage word line requirements more difficult and real estate consuming to implement. Poly 2 control or steering gate 108 on the other hand could be common to a multiplicity of word lines (e.g. a sector consisting of 4 or more word lines), putting less demands on real estate and minimal impact to performance. Possible drawbacks of this approach are the process and device requirements to support both negative as well as positive polarity high voltage circuitry, and reduced steering effectiveness in that the channel cannot assist in steering by virtue of it being held at or near ground (i.e. can't go to large negative potential).

Note that poly 2 is used only as a steering electrode during all three operations. Poly 3, which is the word line connection to the X-decoder, only sees 0V to 5V (other than for erase option 2), and its capacitance can be made relatively small. It is relatively easy to generate +5V and −17V on poly 2 since both writing and erasing are slow operations relative to reading and there is no DC current drain. The −17V does require high voltage PMOS in the erase decode, but the +5V on poly 3 aids in reducing the maximum negative voltage required on poly 2 during erase.

The second option of using high word line voltage bias for erase eliminates both of the above potential drawbacks, but burdens the high performance, tightly pitched word line/ driver with high voltage requirement.

Figure 1D:
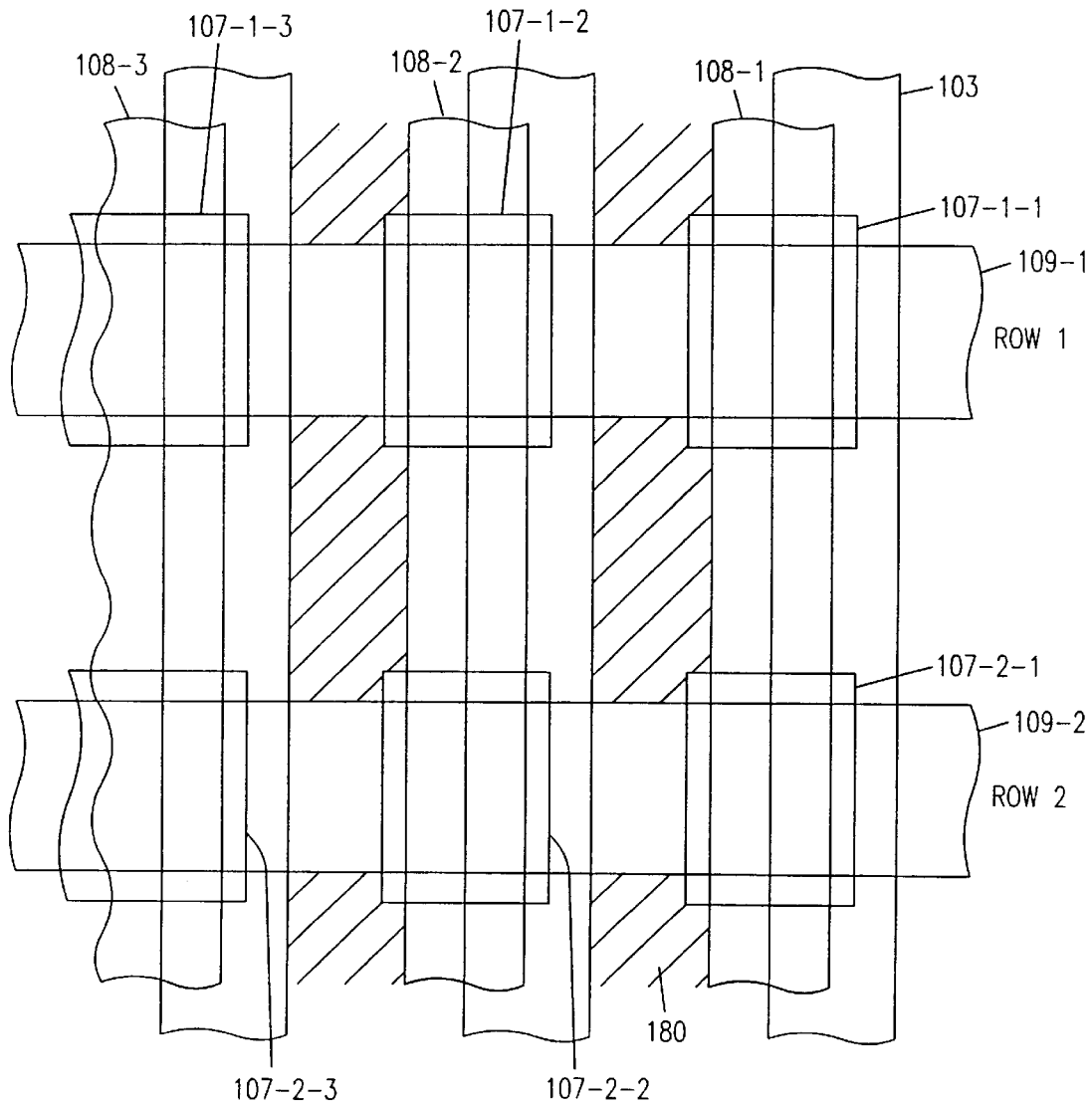
FIG. 1d is a plan view of one embodiment of an array consisting of a plurality of cells of FIGS. 1a–1c.

FIG. 1d is a plan view of one embodiment of an array consisting of a plurality of cells constructed as just described with respect to FIGS. 1a–1c, and using similar reference numerals. Also shown, are channel stop isolation regions 180.

Figure 1E:
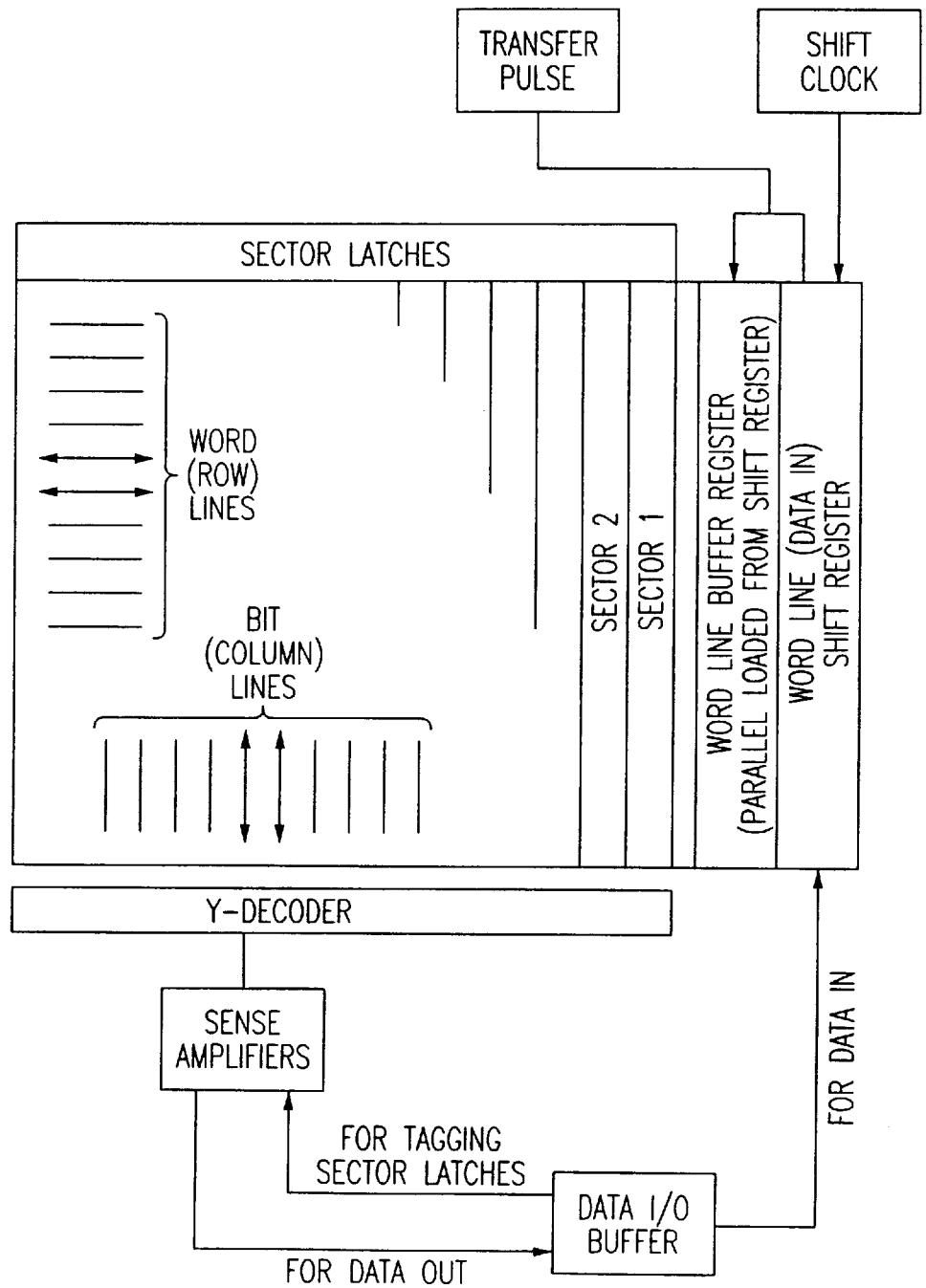
FIG. 1e is a block diagram depicting a memory array organized by sectors, with appropriate control circuitry.
Figure 1F:
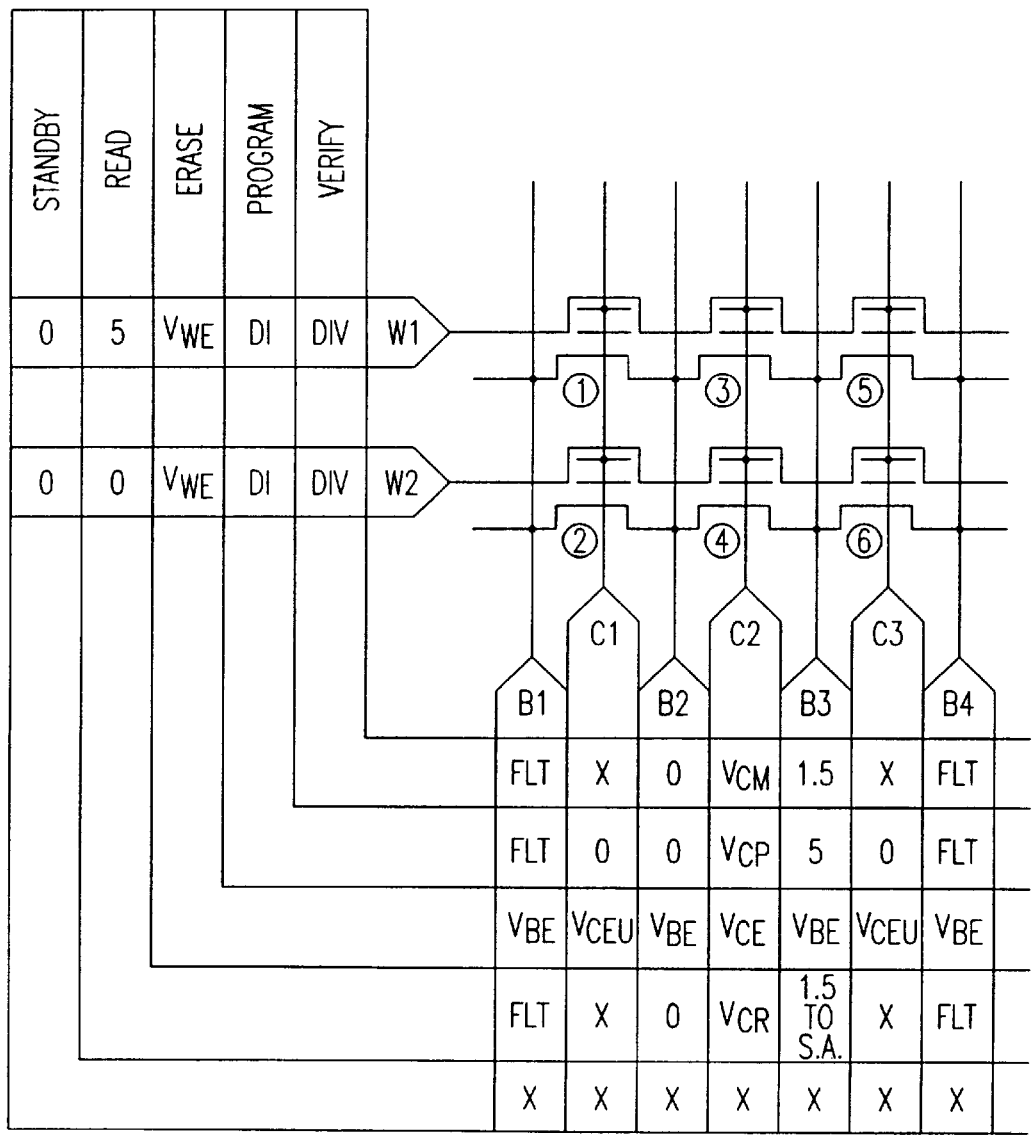
FIG. 1f depicts the operation of one embodiment of a memory array organized by sectors as shown in FIG. 1e.

FIG. 1e shows a block diagram of a memory array similar to that shown in the plan view of FIG. 1d which is organized by sectors, with appropriate control circuitry. Operation of one embodiment of such a memory array organized by sectors is shown in FIG. 1f, where the abbreviations used have the following meanings:

FLT=float
$V_{BE}$=bit line erase voltage
$V_{WE}$=word line erase voltage
DI=data in
DIV=data in during verify operation
$V_{CEU}$=control gate erase voltage—unselected
$V_{CE}$=control gate erase voltage—selected
S.A.=sense amplifier
$V_{CM}$=control gate margin voltage (during verify operation)
$V_{CP}$=control gate program voltage
$V_{CR}$=control gate read voltage
$V_{CE}$=control gate erase voltage As shown in FIGS. 1e and 1f, in this embodiment sectors are formed by a single column or a group of columns having their control gate connected in common. This allows a high speed shift register to be used in place of a row decoder in order to serially shift in a whole block of column data for the word lines, with the data for each word line being contained in the shift register on completion of its serial loading. The use of such a high speed shift register saves circuit area on an integrated circuit by serving both encoding and latching functions normally performed by a row decoder. Furthermore, speed is improved by including a parallel loaded buffer register which receives data in parallel from the high speed shift register and holds that data during the write operation. While the write operation takes place based upon the data stored in the buffer register, the high speed serial shift register receives the next block of data for subsequent transfer to the buffer register for the next write operation. In one embodiment of this invention, each sector has an associated latch for tagging that sector in preparation for an erase of a plurality of tagged sectors.

In one embodiment of this invention, a sector is formed in a group of four cell columns, each column being 1024 bits tall with a common control gate and an associated sector latch. In this embodiment, verification of programming is performed in parallel on all to-be-programmed cells in a single column. Logical 0 state cells have word lines at 0 volts while logical 1 state cells have word lines at a positive voltage, such as 5 volts. The control gate and drain voltages are reduced to a verify level to allow for proper margin testing and the bit line current is monitored. If all of the to-be-programmed cells have been properly programmed, the bit line current will be 0 or substantially so. If not, it is known that one or more of the to-be-programmed cells in the column have not been properly programmed, and another write operation is performed on the entire column, thereby assuring that any incompletely ones of the to-be-written cells are again written. An additional verify step is performed to verify that the column has been properly programmed.

Figure 7A:
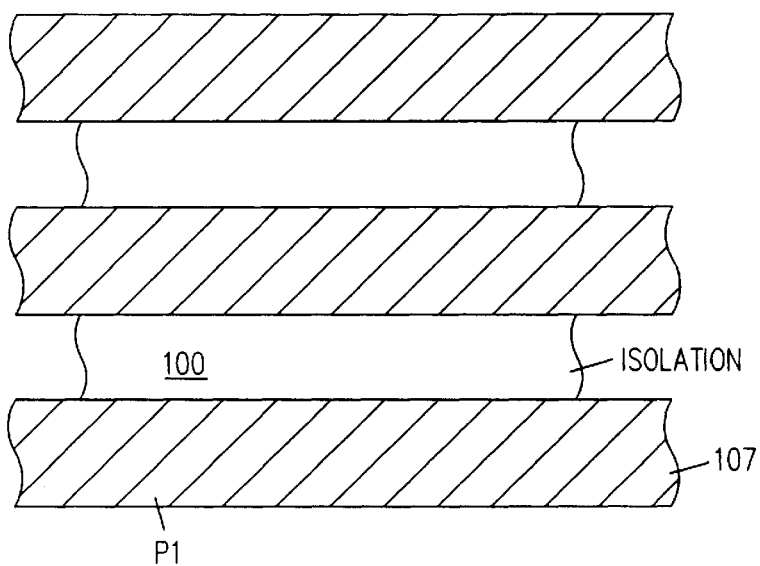
FIG. 7a is a plan view depicting a portion of a process sequence utilized in accordance with one embodiment of this invention.
Figure 7B:
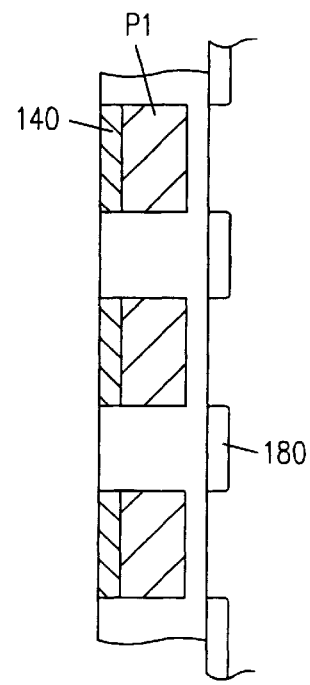

One embodiment of a process suitable for fabricating the structure having the cross-sectional view of FIG. 1b is now described. This embodiment can be implemented in a very small area with no need for an isoplanar oxide when utilizing a virtual ground, allowing an isolation implant to be placed in the remaining field which is not covered by diffusions or polycrystalline silicon and avoids susceptibility to substrate pitting associated with the SAMOS etch in the field isolation region not covered by poly 1. This is achieved, for example, with the following process sequence:

1. Form BN$^+$ bit lines in vertical strips. Grow approximately 1500 Å oxide on top of BN$^+$, and approximately 200–300 Å gate oxide.
2. As shown in FIGS. 7a and 7b, deposit poly 1 to a suitable conductance and etch in horizontal strips perpendicular to the BN$^+$ diffusion. Fill the spaces between adjacent strips of poly 1 with deposited oxide, such as CVD followed by an etch back. This approach protects the field isolation regions, and if desired it can be preceded by a boron channel stop implant.

An alternative for steps 1 and 2 of the above process sequence is forming horizontal strips of isolation oxide first, and then depositing P$_1$ and etched back in RIE to fill and planarize the horizontal grooves between adjacent strips of isolation oxide.

3. Form thin dielectric 140 such as ONO of approximately 300–400 Å. covering poly 1 strips.
4. Deposit poly 2 and form a suitably thick dielectric overlayer (e.g., approximately 2000–3000 Å of CVD densified oxide). Etch this oxide and underlying poly 2 in long vertical strips parallel to bit line (BN$^+$) diffusions.
5. Form oxide spacers 62 along edges of poly 2 and use edge of these spacers to define the floating gate by etching off exposed poly 1 (i.e. poly 1 not covered by poly 2 or by spacer).
6. Form tunnel erase oxide in a conventional manner, as described in U.S. patent application Ser. No. 323,779, filed Mar. 15, 1989, over exposed edges of poly 1 as well as gate oxide over the channel of the select transistor (channel 106-1 in FIG. 1b).
7. Deposit poly 3 or polysilicide, and form word lines in horizontal strips.

Figure 8:
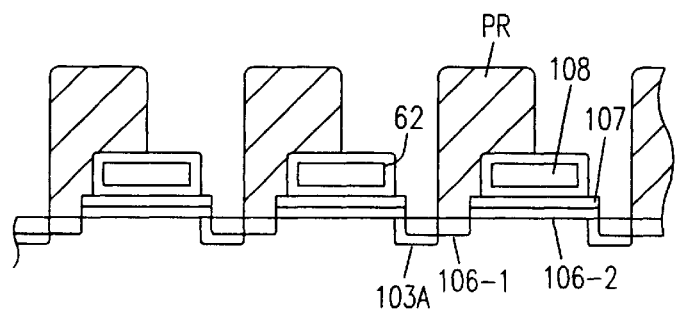
FIG. 8 is a cross-sectional view depicting a fabrication step suitable for use in accordance with the teachings of this invention.

Another embodiment for achieving a virtual ground cell without the use of the buried diffusion formed early in the process is now described. In place of the BN$^+$ of step 1, after step 6 a photoresist (PR) masked arsenic source/drain implant 103a is used, self-aligned to one edge of poly 2 108 after poly 1 107 stack formation but leaving an unimplanted region along the other edge to become the poly 3 controlled select transistor channel (see FIG. 8). The isolation oxide thickness formed earlier between poly 1 strips is made sufficiently thick to withstand the self-aligned poly 2/1 stack etch without exposing the substrate to pitting, but thin enough such that following this stack etch it is readily removed to expose the substrate to the source drain implant. This offers the benefit of reduced thermal drive of the arsenic junction laterally facilitating scaling. The remainder of the process steps of this embodiment follows the prior embodiment.

In summary, the novel cell of this invention offers the following benefits.

Very low programming current.

Low programming drain voltage requirement/eliminating the need for high voltage.

Immunity of Programmability to increased levels of erase.

Adjustability of memory state for optimum read of both program and erased states.

Improved margin by elimination of sensitivity to ±10% Vcc variation on the steering element.

Potential for pure low voltage word line/decoder implementation.

Facilitates multi-state cell sensing.

Reduced susceptibility to source side hot-electron programming induced trapping by establishing a separate threshold control region at the drain.

Figure 1G:
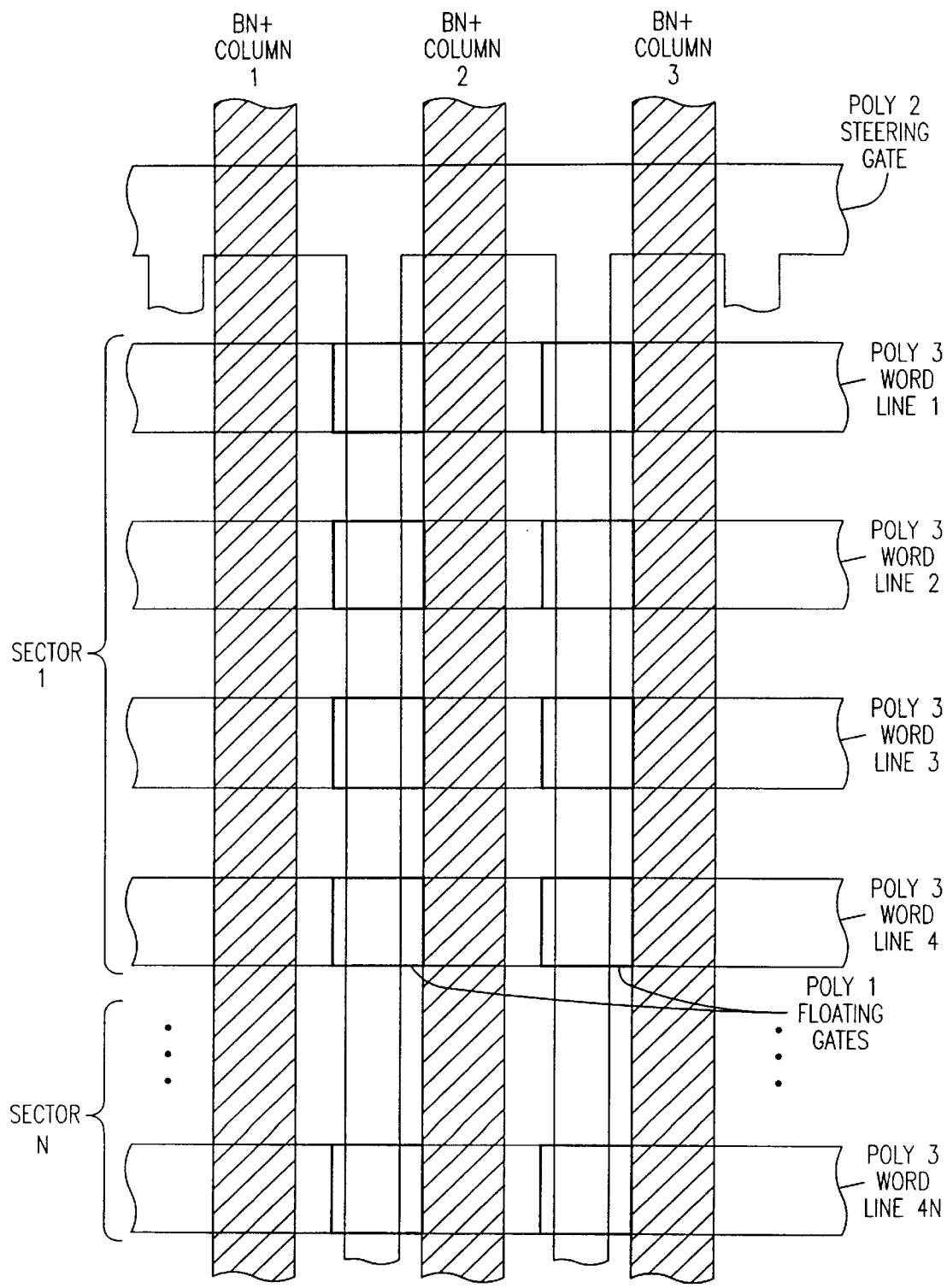
FIG. 1g is a plan view depicting an alternative array embodiment utilizing cells depicted in FIGS. 1a–1c.

A second array embodiment is similar to that of FIG. 1d but uses the cell embodiment shown in FIG. 1b, to form a row oriented sector architecture, is shown in FIG. 1g. A sector consists of a group of rows, four in this example, which are erased together. Erase uses option 2 of Table 1, for this row oriented sector architecture, bringing all the poly 3 word lines of a sector to high voltage. The poly 2 steering gate is common to a group of N sectors where N can range from 1 to the full size of the memory array. Similarly the BN$^+$ columns can alternatively continuously span the full length of the array or be broken down into a collection of shorter length, local columns. These connect to a global (full array length) column through a select transistor driven by an additional level of decoding. The local columns can range from 1 to N sectors. The preferred embodiment is to have local columns span the same number of sectors as the poly 2 steering gate. A preferred number of sectors, N, spanned by local columns and poly 2 steering is around 8. This is because if N is much smaller than 8, the area overhead for local column section devices and poly 2 steering gate routing is high in relation to the area of arrayed cells, while if N is much larger than 8, the benefits of having localized columns and poly 2 steering diminish. These benefits are: (1) reduced bit line capacitance improving read performance; (2) reduced repetitive exposure on unselected sectors to the raised voltage conditions on drains and steering electrodes when programming one sector within the N-sector group, and associated potential disturb phenomena; and (3) increased confinement of array related failures thereby increasing the efficiency of replacing such failures. Read, program and unselected conditions are as described in Table 1, during read or program. The poly 3 word line in the selected row within the selected sector is turned on, 5 volts for read and approximately 1 volt for programming. Concurrently, the drain to source bias conditions are applied to the columns, approximately 5 volts for program and approximately 1.0–1.5 volts for read. In one embodiment, alternate bits in a selected row are programmed simultaneously, thereby permitting all bits in a selected row to be programmed utilizing two programming operations. In a similar manner, in this alternative embodiment, alternate bits in a selected row are read (or verified) simultaneously, thereby permitting all bits in a selected row to be read (or verified) utilizing two read (or verify) operations. After one row in the sector has finished reading or writing, the next row is selected, and so forth to the end of the sector. The resulting row oriented sector architecture and array operation is much more conventional than the column oriented sector of the first embodiment, and consequently operates in a more traditional manner. Both embodiments share the intrinsic low power capability of this invention, but the row oriented sector embodiment requires, in addition, a full complement of data registers to support massively parallel write and verify features.

Figure 2A:
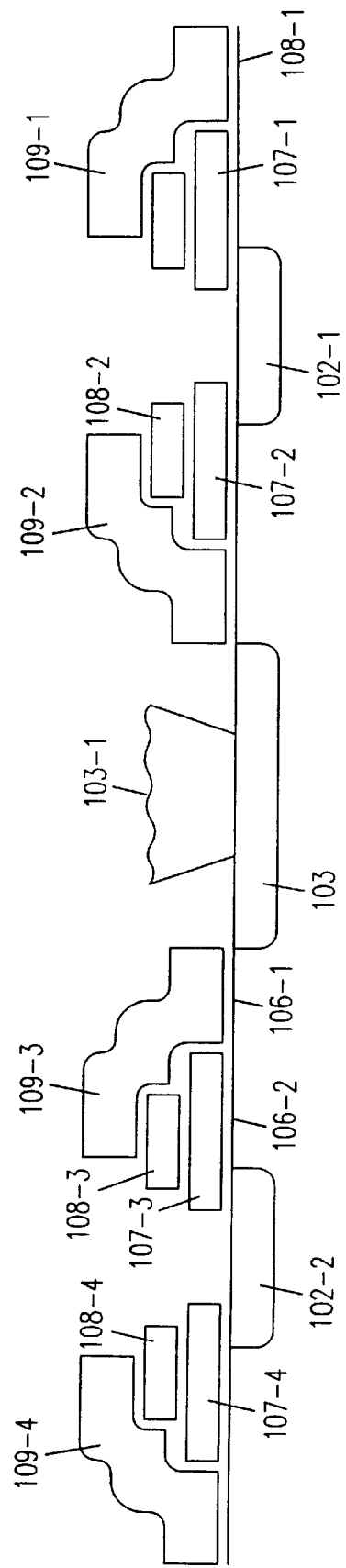
FIG. 2a is a cross-sectional view depicting an alternative embodiment of this invention similar that of FIG. 1b.

FIG. 2a shows an alternative array embodiment of this invention which does not utilize buried diffusion regions. Thus, source region 102 and drain region 103 are formed in a conventional manner and not buried by a thick dielectric layer as is the case in the embodiment of FIG. 1b. A plurality of memory cells are shown in FIG. 2a along a cross section of a typical array structure, with elements of one such cell numbered using reference numerals corresponding to similar structure in FIG. 1b. Table 3 depicts an example of the operating conditions appropriate for the embodiment of FIG. 2a. This a more traditional cell approach compared to the buried diffusion cell, with source/drain diffusions formed after all the polycrystalline silicon structures are formed. It requires one drain contact to metal bit line for every 2 cells, making it approximately 30% to 50% larger than the buried diffusion cell with similar layout rules. In all other respects, this alternative embodiment offers the same benefits as listed above for the buried diffusion embodiment of FIG. 1b.

Figure 2B:
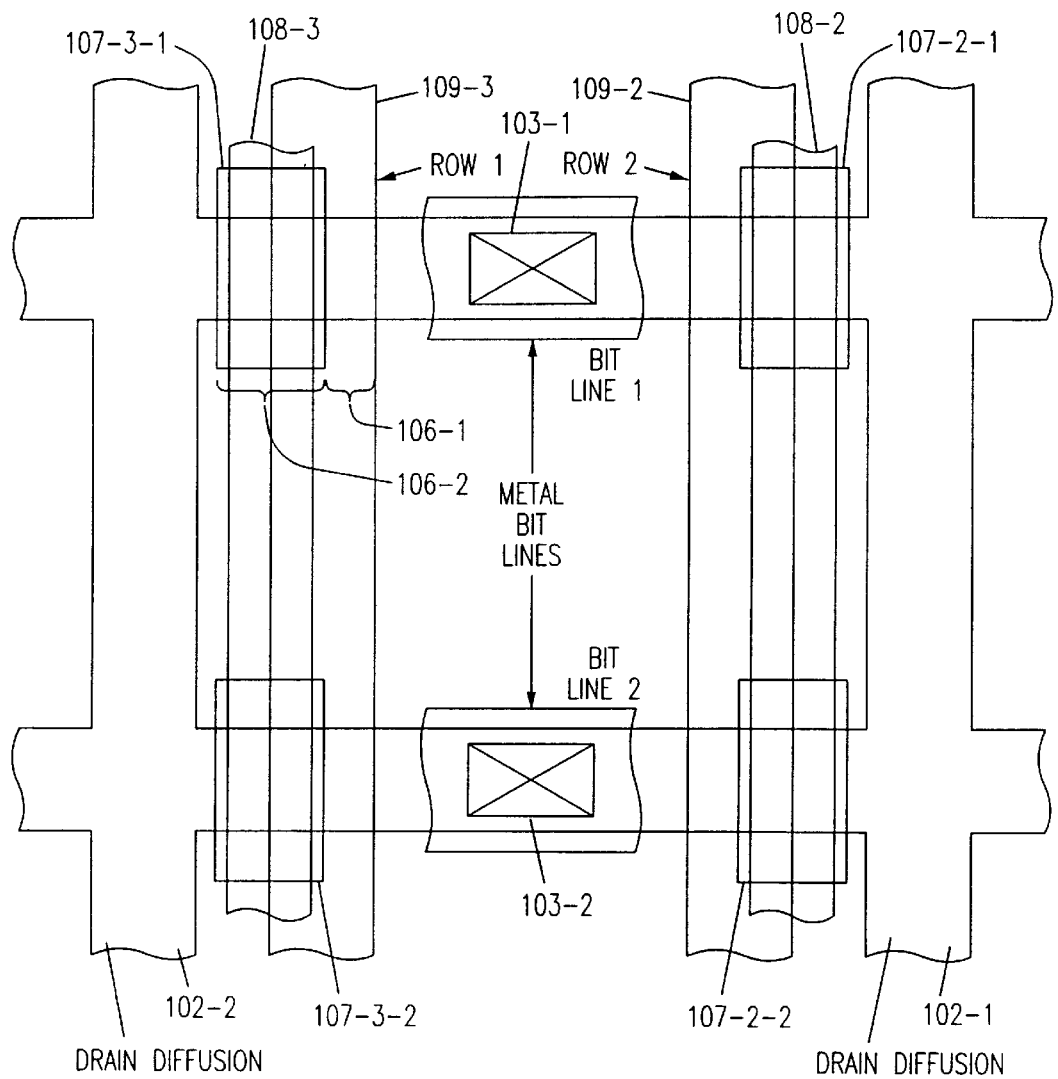

FIG. 2b is a plan view of one embodiment of an array of memory cells constructed as described above with reference to FIG. 2a.

Figure 2C:
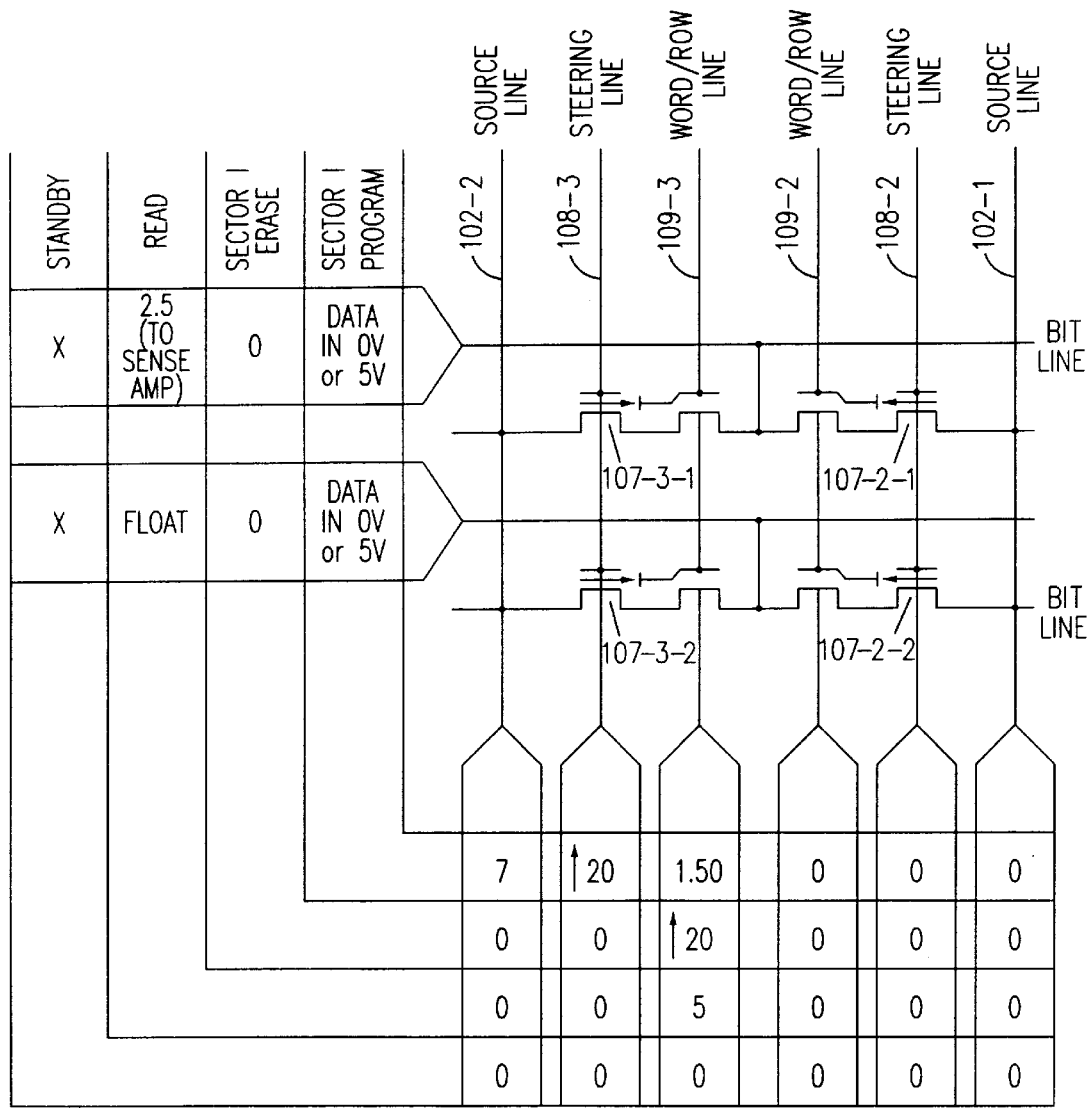
FIG. 2c is a diagram depicting the organization and operating condition of an array such as that of FIG. 2b.

FIG. 2c is an equivalent circuit diagram depicting the organization of such a memory array in sectors, with appropriate operating conditions and voltages shown. The preferred embodiment for a sector organized array uses two word lines which straddle a source line as part of a sector, along with their associated poly 2 steering gates and source line. A full sector consists of some multiple of such pairing line (e.g. 2 such pairs or 4 word lines, each word line containing 128 bytes and overhead cells, and straddling two source lines, constitute one sector).

As shown in the embodiment of FIG. 2c, the steering lines are connected together within a sector as are the source lines (i.e. a sector which consists of row lines grouped together respectively and driven by common drivers). The embodiment described here confines the write operation to the sector being written to, while the bit line bias conditions (2.5v during read and approximately 5v possible during write) are non-disturbing to the cells because the bias is applied to the select transistor side of the cell and not to the floating gate side. In a two state cell, to write the cell to a logical one, the bit line is held at zero volts, causing the cell to program via source-side injection. Conversely, to inhibit writing, the bit line is held high (typically about 5 volts), thereby cutting off the channel, leaving the cell in the erased state.

Sector erase takes place by tagging the selected sector and raising the associated row lines to a sufficiently high voltage to erase the floating gates to their required erased levels.

Because of the low programming currents associated with source side injection (approximately 1–5 microamps/cell), massive parallel programming is made practical, e.g. a full row line of approximately 1000 cells is programmed in a single operation with total current less than approximately 1–5 mA, thus providing more than 100 times more efficiency than prior art drain side programming arrays.

TABLE 3

State Table & Operating Conditions (FIG. 2a)

| Node Operation | | | Poly 3 (Word line) | Poly 2 (Steering Gate) | Drain | Source |
|---|---|---|---|---|---|---|
| R | R | STANDBY | 0v | 0v | Don't care | 0v |
| E | E | READ SELECTED | 5v | 0v | 2.5v | 0v |
| A | L | READ UNSELECTED | 5v | 0v | Don't care | 0v |
| D | A | | | | | |
| | T | | | | | |
| | E | | | | | |
| | D | | | | | |
| E | R | STANDBY | 0v | 0v | 0v | 0v |
| R | E | | | | | |
| A | L | | | | | |
| S | A | | | | | |
| E | T | ERASE Option 1 | 12v–22v | 0v | 0v | 0v |
| | E | | | | | |
| | D | Option 2 | 5v | −10v to −12 v | 0v | 0v |
| P | R | PROGRAM SELECTED | H1.0v | 14–20 | 0v | 5v–8v |
| R | E | | | | | |
| O | L | | | | | |
| G | A | | | | | |
| R | T | PROGRAM UNSELECTED | 0v | 14–20 | 0v | 5v–8v |
| A | E | | H1.0v | 14–20 | 5v | 5v–8v |
| M | D | | 0v | 14–20 | 5v | 5v–8v |

Figure 3:
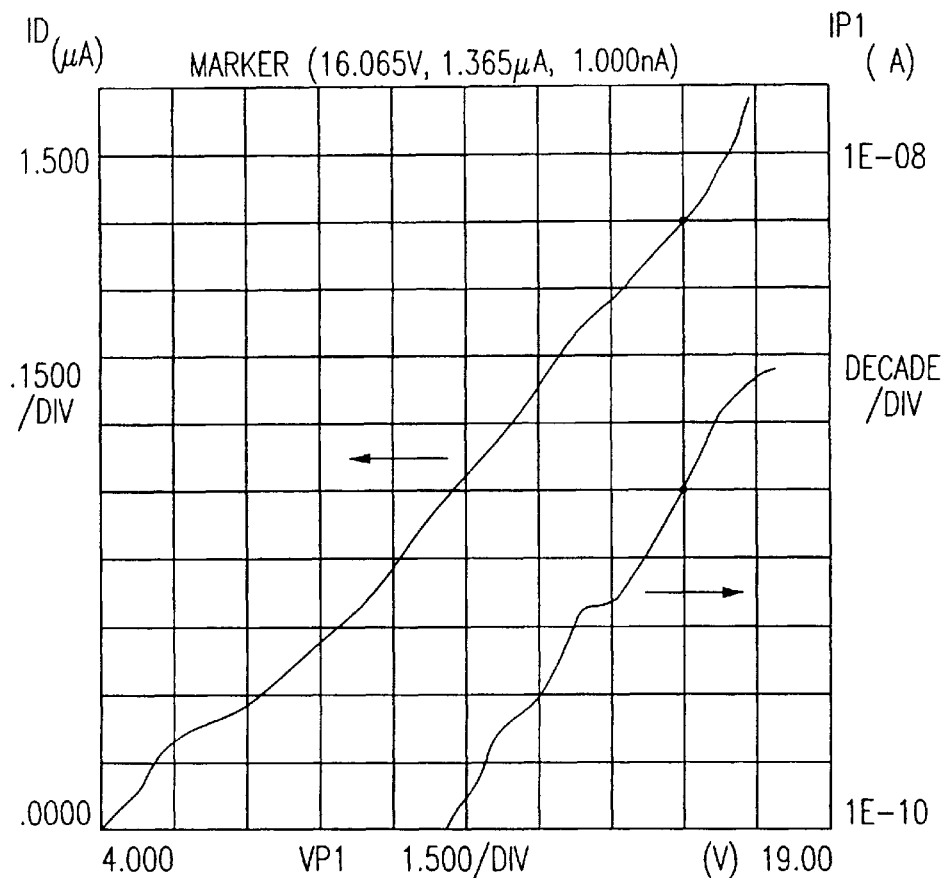
FIG. 3 is a graph depicting the operation of a memory cell of FIG. 1b.

FIG. 3 is a graph depicting the gate current into poly 1 gate 107 of FIG. 1b (which is not floating in the FIG. 3 test device to allow this measurement to be made) as a function of poly 1 gate voltage ($V_{poly\ 1}$) while keeping the select transistor 110 $V_{p2}$ at just above its threshold. In this way most of the potential drop in channel 106 of FIG. 1 occurs in channel portion 106-1 underneath gate 109 of select transistor 110, and electrons accelerated in this channel are then injected onto floating gate 107. From FIG. 3 it is seen the hot electron programming injection efficiency of this device is phenomenally high.

Various embodiments of a process suitable for fabricating a structure in accordance with the embodiment of FIGS. 1a–1d are now described. Reference can also be made to copending U.S. application Ser. No. 323,779 filed Mar. 15, 1989 (now U.S. Pat. No. 5,070,032), and assigned to Sandisk, the assignee of this invention. Reference may also be made to fabrication process steps described earlier in this application. A starting substrate is used, for example a P type substrate (or a P type well region within an N type substrate). A layer of oxide is formed, followed by a layer of silicon nitride. The layer of silicon nitride is then patterned in order to expose those areas in which N+ source and drain regions are to be formed. The N+ source and drain regions are then formed, for example, by ion implantation of arsenic to a concentration of approximately $1 \times 10^{20}$ cm$^{-3}$. The wafer is then oxidized in order to form oxide layers 104 and 105 in order to cause source and drain regions 102 and 103 to become "buried". Note that for the embodiment of FIG. 2a, this oxidation step is not utilized, as the source and drain regions are not "buried". Rather, the source and drain regions are formed after all polycrystalline silicon layers are formed, in a conventional manner. The remaining portion of the nitride mask is then removed, and the oxide overlying channel regions 106-1 and 106-2 is removed. A new layer of gate oxide overlying channel regions 106-1 and 106-2 is formed, for example to a thickness within the range of 150 Å to 300 Å and implanted to the desired threshold (e.g. approximately −1v to +1v). Polycrystalline silicon is then formed on the wafer and patterned in order to form floating gate regions 107. If desired, the polycrystalline silicon layer is patterned in horizontal strips (per the orientation of FIG. 1a), with its horizontal extent patterned at the same time as the patterning of the second layer of polycrystalline silicon, as will be now described. Following the formation polycrystalline silicon layer 107 at this time, a layer of oxide or oxide/nitride dielectric is formed over the remaining portions of polycrystalline silicon layer 107. A second layer of polycrystalline silicon 108 is then formed and doped to a desired conductivity, for example 30 ohms/square. The second layer of polycrystalline silicon is then patterned into vertical strips (again, per the orientation of FIG. 1a). If the horizontal extent of polycrystalline silicon layer 107 was not earlier defined, this pattern step is also used to remove the layer of dielectric between the first and second layers of polycrystalline silicon in those areas where the first layer of polycrystalline silicon is to be patterned simultaneously with the patterning of the second layer of polycrystalline silicon. Following the first layer patterning, an additional layer of dielectric is formed on the wafer to form the gate dielectric above channel region 106-1, and above any other areas in the silicon substrate to which the third layer of polycrystalline silicon is to make a gate. These regions can then be implanted to the desired threshold voltage (e.g. approximately 0.5v to 1.5v). The third layer of polycrystalline silicon is for a transistor (ranging from 200 Å to 500 521 in thickness) then formed and doped to appropriate conductivity, for example 20 ohms/square. Polycrystalline silicon layer 109 is then patterned in order to form word line 109.

In one embodiment of this invention, polycrystalline silicon layer 107 is patterned to form horizontal stripes and channel stop dopants (e.g. boron) are implanted into the exposed areas therebetween in order to form high threshold channel stop regions between adjacent rows of a memory array. The thickness of the gate dielectric between channel 106-2 and polycrystalline silicon floating gate 107 can range from approximately 150 angstroms or less to approximately 300 angstroms or more, depending on performance tradeoffs. For increased drive for reading, a thinner gate dielectric is desired while for increased coupling between polycrystalline and silicon control gate 108 and floating gate 107 (helpful during programming) a thicker gate dielectric is desired.

Second Embodiment

Figure 5:
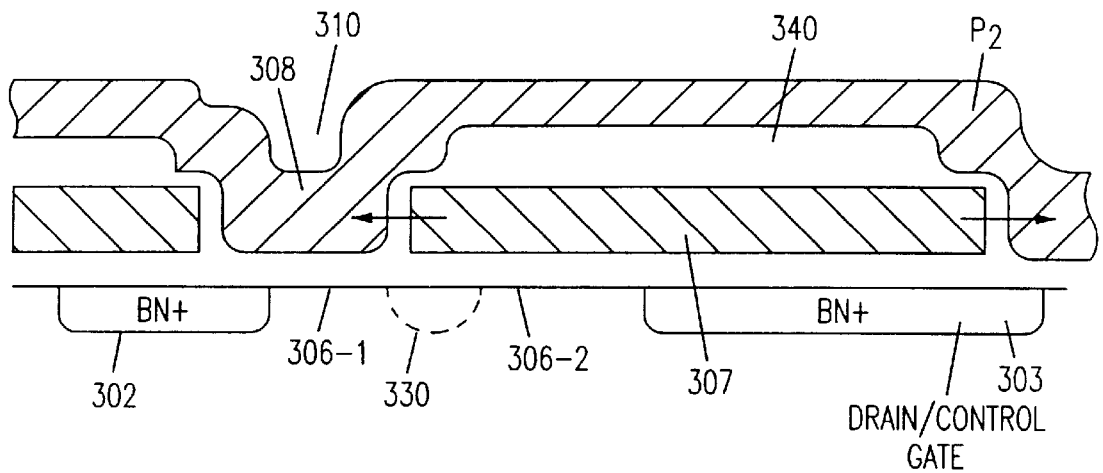
FIG. 5 is a cross-sectional view one embodiment of a 2-poly cell of this invention.

FIG. 5 is a two-poly embodiment in which programming occurs by taking drain 303 high, for example about 10V while raising control gate 308 just sufficiently so as to turn on select transistor 310. Since this $V_{CG}$ voltage can vary from one device to another it is possible to achieve the optimum injection conditions by keeping $V_{CG}$ at about 3V while raising source (virtual ground) 302 in a sawtooth fashion from about 0 to 3 volts and back to 0 again, with a period on the order approximately 1 microsecond.

This ensures that at some point along the sawtooth the optimum injection conditions are met. Reference can also be made to European Patent Application Serial No. 89312799.3 filed Aug. 12, 1989. To further enhance programming efficiency, in one embodiment a programming efficiency implant 330 (shown in dotted line) is introduced at the source side. To read the device, its source is 0V, drain is approximately 1.0v and $V_{CG}$ approximately 4.5–5v. To erase we employ poly 1-poly 2 tunneling between floating gate 307 in word line 308 at the tunneling zone, consisting of one or more of the floating gate edges, sidewall, corners of the top edge, portions of the top and portions of the bottom, of floating gate 307, associated with a tunnel oxide (400 Å–700 Å). Erase takes place with $V_{CG}$ approximately 12–22V, $V_D$=0V, $V_S$=0V. A capacitive decoupling dielectric (approximately 1500 to 2000 Å thick) 340 is formed on top of poly 1 to reduce the capacitance between poly 1 and poly 2.

In one embodiment of this invention, a high electrical field region is created in the channel far away from the reverse field region located in conventional devices near the drain. This is achieved, for example, by utilizing region 330 of increased doping concentration at the boundary between channels 306-1 and 306-2 under floating gate 307. In one embodiment, the width of region 330 is on the order of 0.1 microns. A larger dimension for region 330 can be counterproductive, reducing the select transistor drive with no gain in efficiency.

Figure 4:
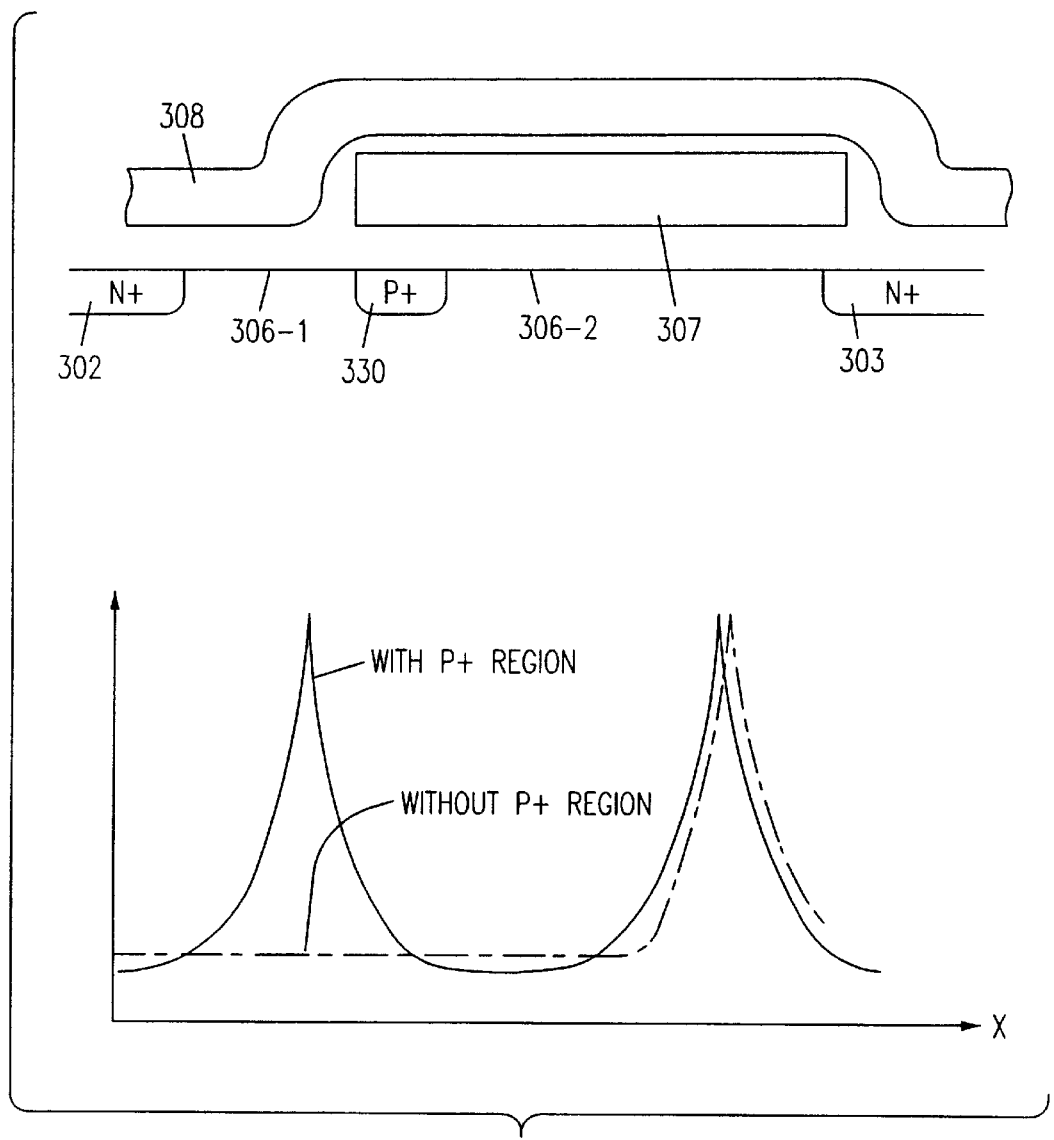
FIG. 4 depicts the electrical field distribution along channels of the device of FIG. 5.

FIG. 4 depicts the electrical field distribution along channels 306-1 and 306-2 in structures with and without P+ doped region 330. In a structure without region 330 and improperly biased select transistor the electron injection can take place in the high field region near drain 303. Because of the vertical field reversal region near drain 303, the resultant injection efficiency is reduced. In a structure with region 330 the injection takes place in the high field region located at region 330, far away from the field reversal region. Because of this, increased injection efficiency is achieved.

From the processing side there are three problems which must be addressed properly:

1. The formation of sufficiently thin/high quality gate dielectric over BN+, which tends to oxidize more quickly than undoped silicon.
2. The misalignment between poly 1 and the buried N+ drain diffusion strongly affects the coupling ratios for programming and erase. This can be overcome at the expense of an increase in cell area by not using a virtual ground array, but instead a shared source array.
3. This array permits floating gate 307 to completely overlap the buried N+ diffusion in a dedicated source arrangement, eliminating this alignment sensitivity. Unfortunately, this array requires an extra isolation spacing adjacent to the BN+ to prevent the poly 1 extension beyond BN+ in the direction away from channel 306-2 to form a transistor in the neighboring cell.

To achieve small cell size in the buried diffusion direction a channel stop isolation is used between adjacent cells, plus a self-aligned stacked etch to simultaneously delineate poly 2 and poly 1. This is difficult to do without pitting the substrate as well as the exposed BN+ when etching the exposed poly 1 between adjacent cells. This is especially difficult to avoid when etching the decoupling oxide (1500–2000 Å thick on top of poly 1 in order to expose poly 1, since the substrate unprotected by poly 1 also becomes exposed, so that when poly 1 is etched, the substrate in those regions becomes pitted.

This will therefore require formation of a thick dielectric region as part of the field isolation process protecting the substrate in the space between the poly 2 word lines. This can be accomplished by using a process as described in U.S. patent application Ser. No. 323,779, filed Mar. 15, 1989, and assigned to Sandisk, the assignee of this application. This is actually forming trench isolation, but with BN+ abutting this trench, we may experience severe junction leakage as well as loss of a portion of the BN+ conductor. This cell of this second embodiment is attractive because it is double poly, low programming current, very fast programming, programming away from drain junction, small and scalable cell. Cell size is quite attractive as indicated below for three representative geometries:

1.0 m geometries: cell=4.0×2.0=8.0 m²
0.8 m geometries: cell=3.2×1.6=5.2 m²
0.6 m geometries: cell=2.3×1.2=2.8 m²

Third Embodiment

Figure 6:
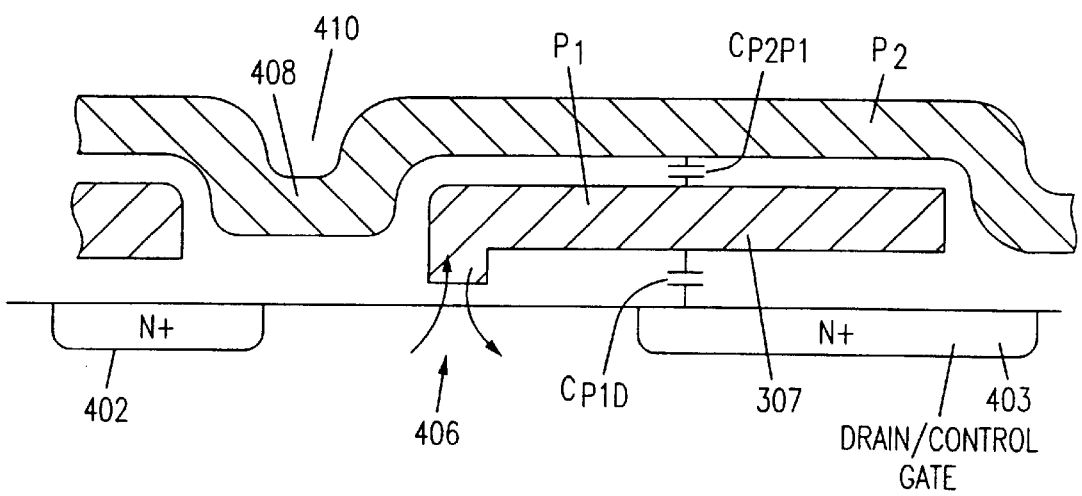
FIG. 6 is a cross-sectional view of another embodiment of a 2-poly cell of this invention.

FIG. 6 is a cross-sectional view of alternative embodiment of a two poly cell, using source side injection for programming, aided by strong coupling to buried N+ drain 403, which acts also as a second control gate. Erase is by Fowler-Nordheim tunneling to channel 406 through a small thinned oxide region, formed for example to a thickness of about 100 Å, by utilizing a thin polyspacer. These process steps would be as follows: Once the drain oxide is formed (i.e. the oxide above drain 403), a first layer of poly, (approximately 2000 Å to 4000 Å thick) is deposited and a thin nitride dielectric is deposited on top. These layers are then etched using a poly 1 mask to delineate the lateral extent (as shown in FIG. 6) of the poly 1. A second layer of nitride is then deposited and anistropically etched back to underlying oxide, leaving the initial nitride layer on top of poly 1 plus nitride spacers along the poly 1 sidewalls. This protects the poly 1 sidewall from subsequent oxidation, allowing electrical contact to be made as later described. The exposed oxide layer over the channel portion of the substrate is then stripped and regrown to the 100 Å thickness required for tunneling, while a photoresist masked pattern protects oxide over the exposed, BN+ side of the poly 1 from being stripped. The nitride layers surrounding poly 1 prevent oxide from forming on that poly. The thin nitride is then etched off using a highly selective etch which does not attack or degrade the 100 Å tunnel oxide (e.g. hot phosphoric or plasma etch). This is followed by a second poly deposition which electrically contacts the first poly on its top surface and its sidewalls. This structure is then etched using an anisotropic poly-silicon etch, with etch being terminated with the re-exposure of the oxide layers over substrate beneath the second deposited poly layer. This completes the formation of the poly 1 floating gate stripe shown in FIG. 6. The remaining process is similar to that of the second embodiment.

In this embodiment, programming is from hot channel electrons injected from grounded source diffusion 402 with drain 403 held at about +8v and fixed control gate of around 1.5v. Alternatively, programming is performed by hot channel electrons from source diffusion 402 utilizing a sawtooth control gate voltage ranging from 0 volts to a peak voltage approximately 3 volts, as described previously for the second embodiment. Read is achieved with $V_{DS}$=1.5V, Vs=0, $V_CG$=+5V. Erase is achieved with $V_{CG}$=-22V, Vs=Vd=0V. In this embodiment, the poly 2 word line 408 will carry the +5 volts during read and the -22 volts during erase, thereby requiring an X-decoder capable of serving this purpose. Coupling considerations require that $^CP2P1>CP1D$, which is unfavorable for programming. Therefore the cell must be optimized for balancing erase against programming by adjusting oxide thicknesses and floating gate threshold to the optimum print. There is less of a problem with pitting the field regions between cells in the poly 1 direction (because poly 1—poly 2 oxide or ONO is thin). This may obviate the need for the additional thick oxide field region described for the second embodiment. However, there is the additional process complexity of forming the thin oxide region and extra space needed to place this thin oxide region sufficiently far from the source diffusion.

Alternative Operating Methods

A number of alternative methods are possible to program the source side injection cells described in the previous embodiments. Strong capacitive coupling (for example, using thin ONO) is required in the second and third embodiments between poly 2 and drain, and between poly 2 and poly 1, respectively, for programming. During operation, one embodiment applies $V_D$ at 5 to 7v, $V_S$=0, the control gate voltage $V_{CG}$ is raised to just turn on the control gate channel, and $V_{p2}$ is on the order of about 12 volts or more. Alternatively, the source body effect is used to advantage. In this alternative embodiment, rather than bringing control gate to a specified value to just turn on the channel, the control gate is brought to a value greater than the voltage required to just turn on the channel (e.g., approximately one volt above) and a pull-down circuit is used (e.g., a high impedance resistor or a current sink) for providing approximately 1 μA current flow via source debiasing. Alternatively, the control gate voltage $V_{CG}$ can be operated in a sawtooth fashion from between 0 volts to about +3 volts, as mentioned previously with respect to European patent application serial number 89312799.3.

Multi-bit Cells

Figure 9A:
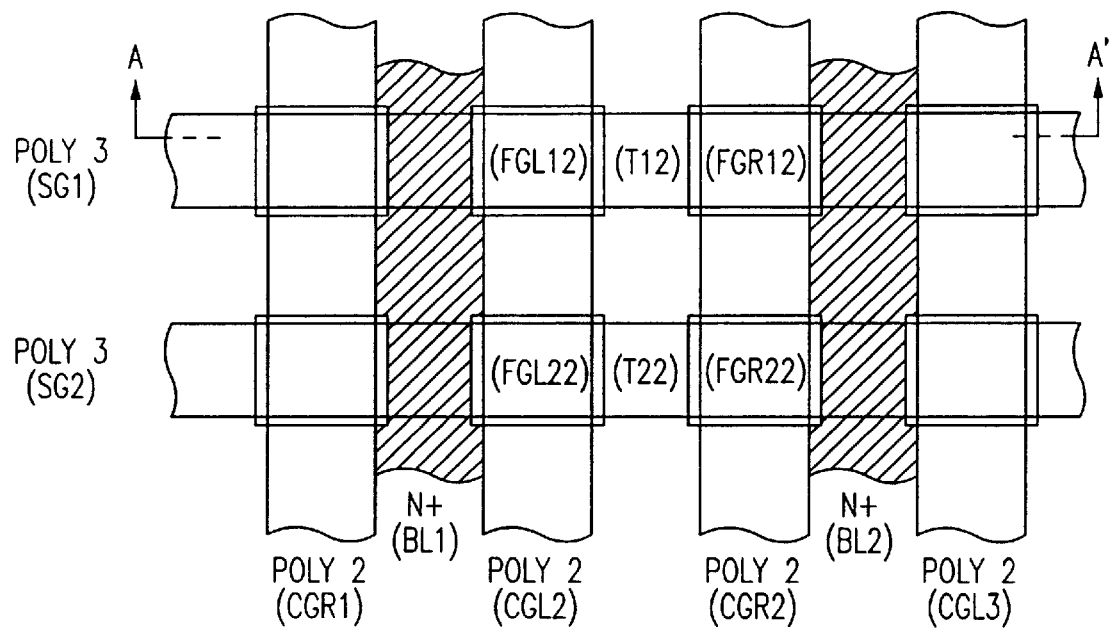
FIGS. 9a and 9b are top and cross-sectional views, respectively of one embodiment of a multiple-bit memory cell structure of this invention.
Figure 9B:
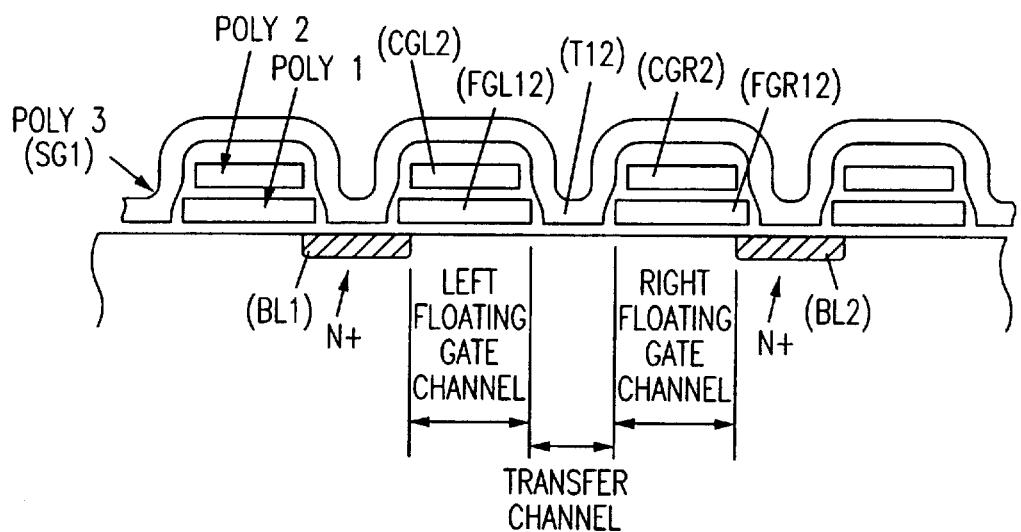

In an alternative embodiment of this invention, such as is shown in FIGS. 9a and 9b, a novel structure is taught including a multi-bit split gate cell, using source side injection programming and using poly-to-poly tunneling for erase. The following describes, in more detail, the operation of one embodiment of such a structure of this invention.

Basic read operation for such a cell consists of applying appropriate control gate bias (e.g. 8v—see TABLE 4) to the unread portion (henceforth for convenience to be termed the transfer portion), while applying the required read control gate bias to the portion being sensed (in multi-state this would be a bias level appropriate to the state being sensed for). In one embodiment, the select gate bias is held at approximately 1.5 volts to keep total cell current limited (e.g. to about 1 microamp), independent of the floating gate conduction level. Alternatively, the select gate bias is maintained at any desired level, e.g. about 5 volts, depending on the current sensing requirements. Similarly, to program a bypass applied on the transfer portion (about 12v) and a writing potential on the control gate portion (again in multi-state this would be a bias level appropriate to the state being written), with the select gate bias throttled for source side emission (about 1.5v), and the drain bit line (the bit line adjacent the to-be-programmed floating gate) raised to about 5v for programming, with the source bit line (adjacent to transfer portion) grounded.

Finally, its immunity to overerase comes from the following two factors: (1) the presence of the series transistor channel select region, which fully cuts off cell conduction when deselected, independent of degree of erasure, and (2) the source-side injection mechanism itself, which is enhanced with strong overerase, in contrast to the more conventional

TABLE 4

OPERATING MODES/CONDITIONS

| CONDITION | | BL1 | CGL2 | SG1 | CGR2 | BL2 |
|---|---|---|---|---|---|---|
| R | STANDBY | X | X | 0v | X | X |
| E | READ UNSELECTED | FLOAT | X | 1.5v | X | FLOAT |
| A | READ FGL12 | 0v | READ VREF | 1.5v | 8v | 1.5v |
| D | READ FGR12 | 1.5v | 8v | 1.5v | READ VREF | 0v |
| P | ERASE | 0v | 0v | VE | 0v | 0v |
| R | STANDBY | X | X | 0v | X | X |
| O | PROG UNSELECTED | FLOAT | X | 1.5v | X | FLOAT |
| G | PROG FGL12 | 5v | PROG VREF | 1.5v | 12v | 0v |
| R | PROG FGR12 | 0v | 12v | 1.5v | PROG VREF | 5v |
| A | | | | | | |
| M | | | | | | |

NOTES:
X - DON'T CARE;
VE - OPTIMUM ERASE VOLTAGE (~<20v)

Following are some key advantages of the multi-bit cell of this embodiment of this invention:

(1) Approaches $(2*lambda)^2$ cell size
(2) Highly self-aligned
(3) High efficiency source side programming, resulting in lower power and lower voltage requirements, allowing greater parallelism during write
(4) Attractive for scalability
(5) Totally immune to overerase This cell can achieve $(2*lambda)^2$ cell size, where lambda is the minimum lithographic feature, because (1) each of its lateral component parts, in both its word line and bit line directions, can be formed using this minimum lambda feature, and (2) the various critical components are self-aligned to one another, obviating the need to increase cell size to accommodate lithographic overlay registration requirements. For example, viewing along the row or word line direction, the floating gate poly2/1 self-aligned stacks and their underlying channels can be formed using the minimum feature lithographic width (lambda), while the transfer channels and bit line diffusions can be simultaneously delineated using the minimum lithographic space between features (also lambda), giving it a (2*lambda) minimum pitch capability along this direction. Similarly, looking along the poly2 steering gate in the bit line direction, the channel regions underlying poly1 floating gate and poly3 word line can be formed using the minimum lithographic feature (lambda), while the isolation region between word line channels can be formed by the minimum lithographic space (also lambda), again achieving the minimum pitch of (2*lambda). In this way, the cell achieves the $(2*lambda)^2$ minimum layout area. It is in fact a self-aligned cross-point cell, the poly2/1 stack and corresponding channel being fully self aligned to the transfer channel and bit line diffusions, and in the orthogonal direction the isolation being self-aligned to the channel areas. When combining this with the low voltage requirement made possible by the source-side injection programming mechanism, this makes it an ideal element for still further scaling (i.e. smaller lambda).

drain-side programming, which becomes retarded by strong levels of erasure.

Figure 10A:
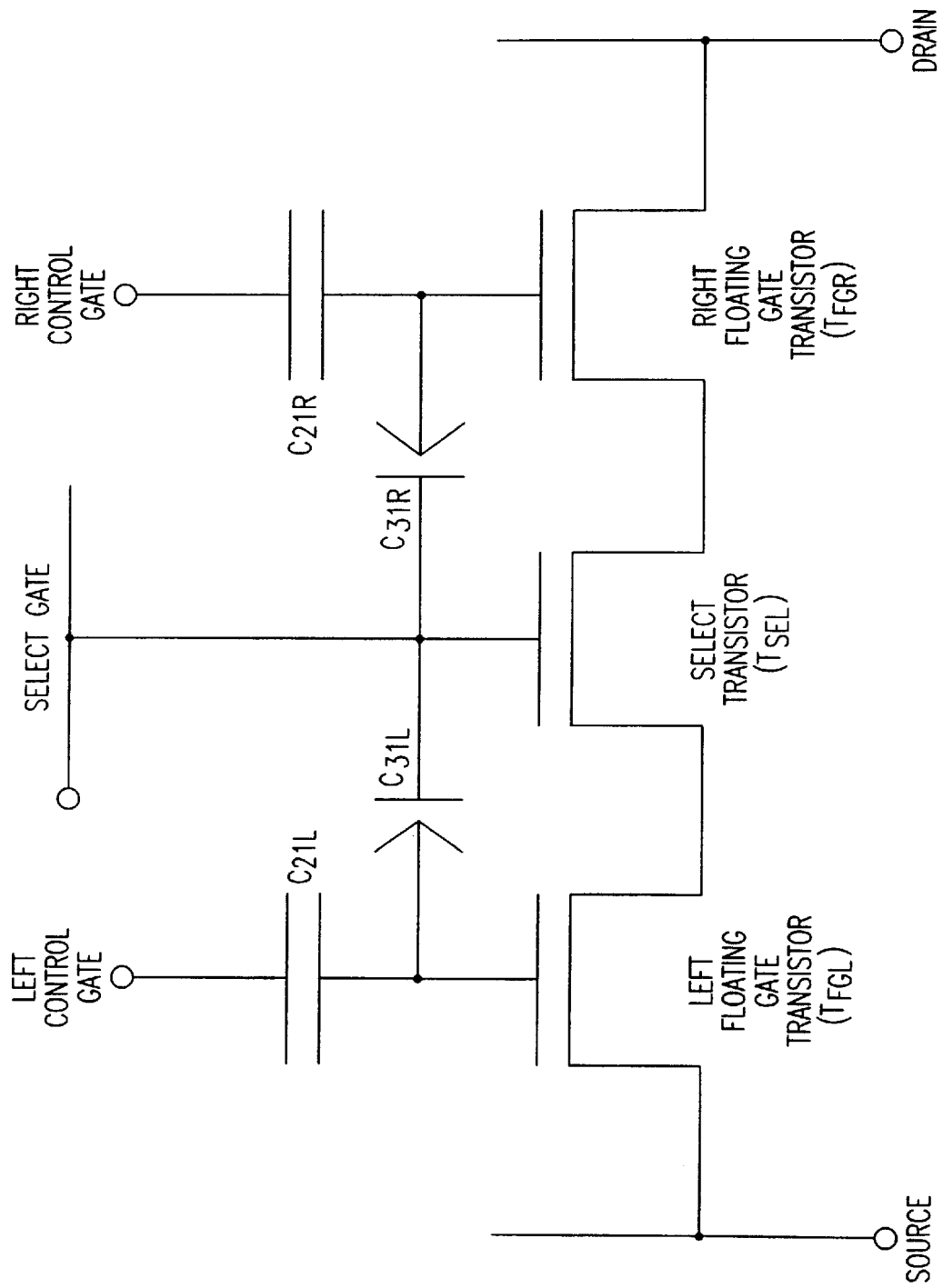
FIG. 10a is a schematic diagram of one multi-bit cell of this invention.
Figure 10B:
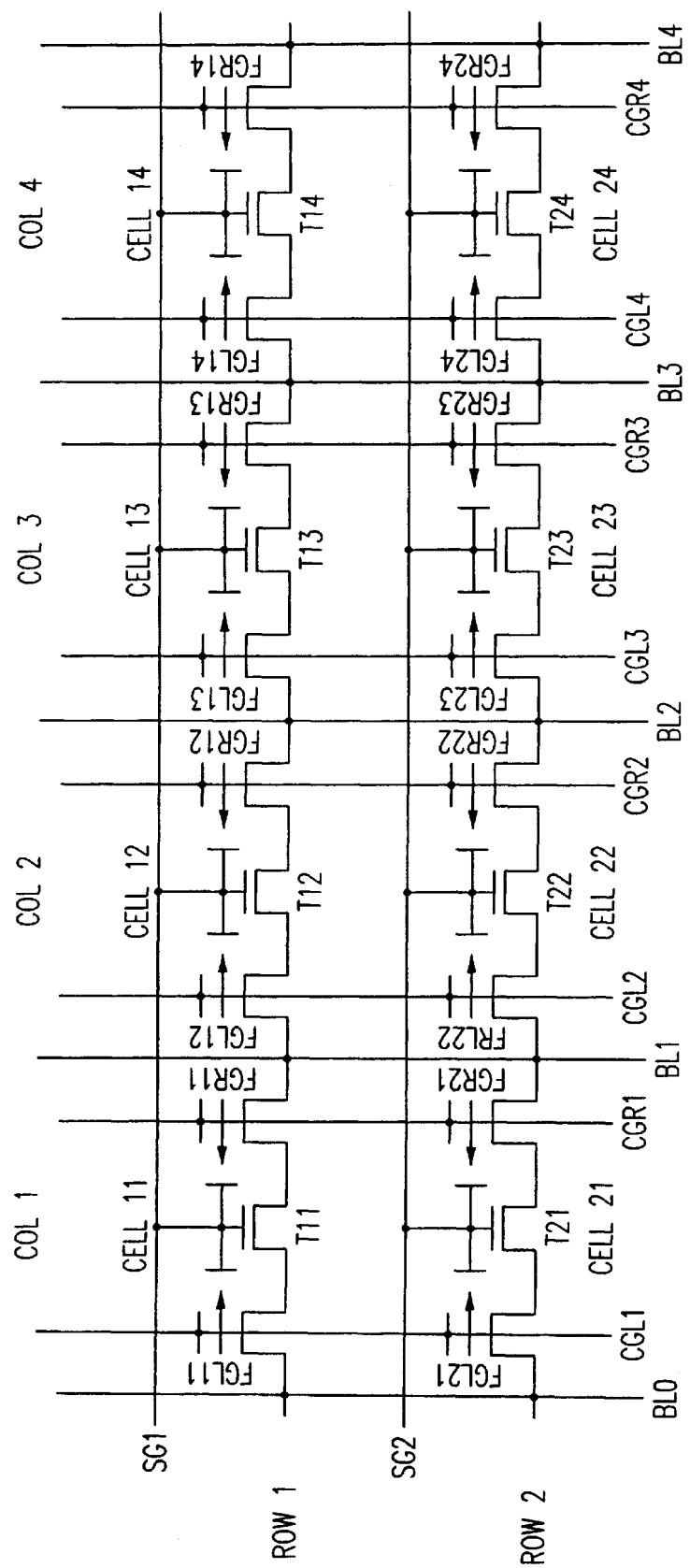
FIG. 10b is a circuit diagram depicting one embodiment of an array of multiple-bit memory cells of this invention, such as those of FIGS. 9A and 9B.

In one embodiment, rather than the use of 100 Å tunneling oxide for the erase operation as in the prior art Ma approach, a thick oxide, geometrically enhanced, poly-to-poly tunneling approach is used, as shown for example in FIGS. 9a and 9b, where the poly3 word line serves the dual function of cell selection and erase anode (one of the architecture/operational approaches taught in the above-mentioned Sandisk U.S. Pat. No. 5,313,421). FIGS. 10a and 10b shows the equivalent circuit of this cell/array and TABLE 4 summarizes its operation.

The advantages of this embodiment include:

Erase unit to follow row line(s), resulting in row oriented sectoring;
Avoids need to use negative voltages, erase being accomplished by holding all electrodes at ground, except for the selected sector(s) poly3 word lines, which are raised to erase potential (about or less than 20v);
High reliability inherent to thick oxide tunneling implementation; and
Improved scalability inherent to the use of the thick interpoly oxide (and consequent reduced parasitic capacitance, both because of the greater thickness and because of the small sidewall vicinity limited tunneling area), combined with the high degree of vertical integration (vertically stacked poly3 word line serving the dual role of select gate and erase electrode).

Such a cell approach offers the potential for a physically minimal $(4*lambda^2)$, highly self aligned, crosspoint cell, which is both very reliable (use of thick oxides and no high voltage junction requirements within memory array), and readily scalable (via the source side injection element and its reduced voltage and more relaxed process control requirements, combined with the inherent salability of the vertically integrated, thick oxide interpoly erase element). From a physical point of view therefore, a Gigabit (or greater) density level embodiment based on a $0.25\mu$ technology, has a per bit area of approximately 0.25 $\mu^2$.

Despite the series nature of the dual gate cell, a four level multi-state (two logical bits per floating gate, or four logical bits per dual gate cell) can be implemented. The key requirement is that the most heavily programmed state plus bias level of the transfer floating gate's control gate be optimally selected to expose the full multi-state conduction range of the memory floating portion, without introducing read disturb. Based on the above example, a four-level multi-state implementation would give a per bit area approaching 0.1 $\mu^2$ (approximately 0.125 $\mu^2$).

In summary, the above described dual-gate cell based on the thick oxide, row oriented erase approach offers a novel, non-obvious implementation, one that offers significant improvements over the prior art in scalability, reliability and performance.

Alternative Embodiment Utilizing Negative Steering Cell Operation

The control gate (or steering) bias voltage level or range of levels for reading constitute a powerful parameter in setting the memory window voltage position and corresponding ranges for the steering element during programming operations and the poly3 control/erase element during erase. By allowing this level or range of levels to go below 0v, this allows shifting up of the floating gate voltage memory window (due to its associated charge) by a proportional amount, governed by the steering gate coupling ratio. The net result is the maximum steering gate voltage level, for both sensing and programming, is reduced by that negatively shifted amount. Similarly, with the steering gate taken below 0v during erase, the maximum erase voltage is also lowered, the amount of which is proportional to the steering gate coupling ratio.

An important parameter in determining steering voltage magnitudes is the steering gate coupling ratio, RCG (or R21)=C21/CTOT, where C21 is the capacitance between the poly1 floating gate and the poly2 steering gate, and CTOT is the total floating gate capacitance. For example, if the net requirement for read plus programming is to capacitively shift the floating gate potential by 10v, then given an RCG of 50%, the steering voltage swing must be scaled up by 1/RCG, giving a 20v swing. If, on the other hand, RCG is increased to 66.7%, the steering voltage swing drops to 15v, a savings of 5v. Using this 66.7% value, if the read steering bias voltage level (or range) is lowered by 7.5v, the poly3 erase voltage is lowered by RCG*7.5v, a savings of 5v over the non-lowered bias situation.

In order to implement negative steering into an N channel based, grounded substrate memory array, one embodiment utilizes P channel circuitry, capable of going negative of ground, to generate and distribute this bias. In order to support the full steering voltage dynamic range, the N well for such P channel circuitry is biased to the maximum required positive voltage, and the P channel circuitry can thus feed any potential from that value on down to the most negative required (independent of memory array ground). The positive and negative voltage limits are provided from either external supplies or readily generated on chip (for example by N channel based charge pumps for positive bias and P channel for negative bias), since no DC current is required for steering (only capacitive load charging).

In one embodiment, a full column oriented array segmentation is implemented to form one sector or a group of row oriented sectors, wherein one sector is read or programmed at any given time. All cells in one sector are erased simultaneously, and one or more sectors can be selected for simultaneous erasure. Column based segmentation breaks a full array into a multiplicity of segmented sub-arrays, thereby eliminating large and/or cumulative parasitics such as capacitance and leakage. Each sub-array has its own set of local bit line diffusions and poly2 steering lines, which are selectively connected by segment select transistor matrixes to corresponding global bit lines and steering lines.

Figure 10C:
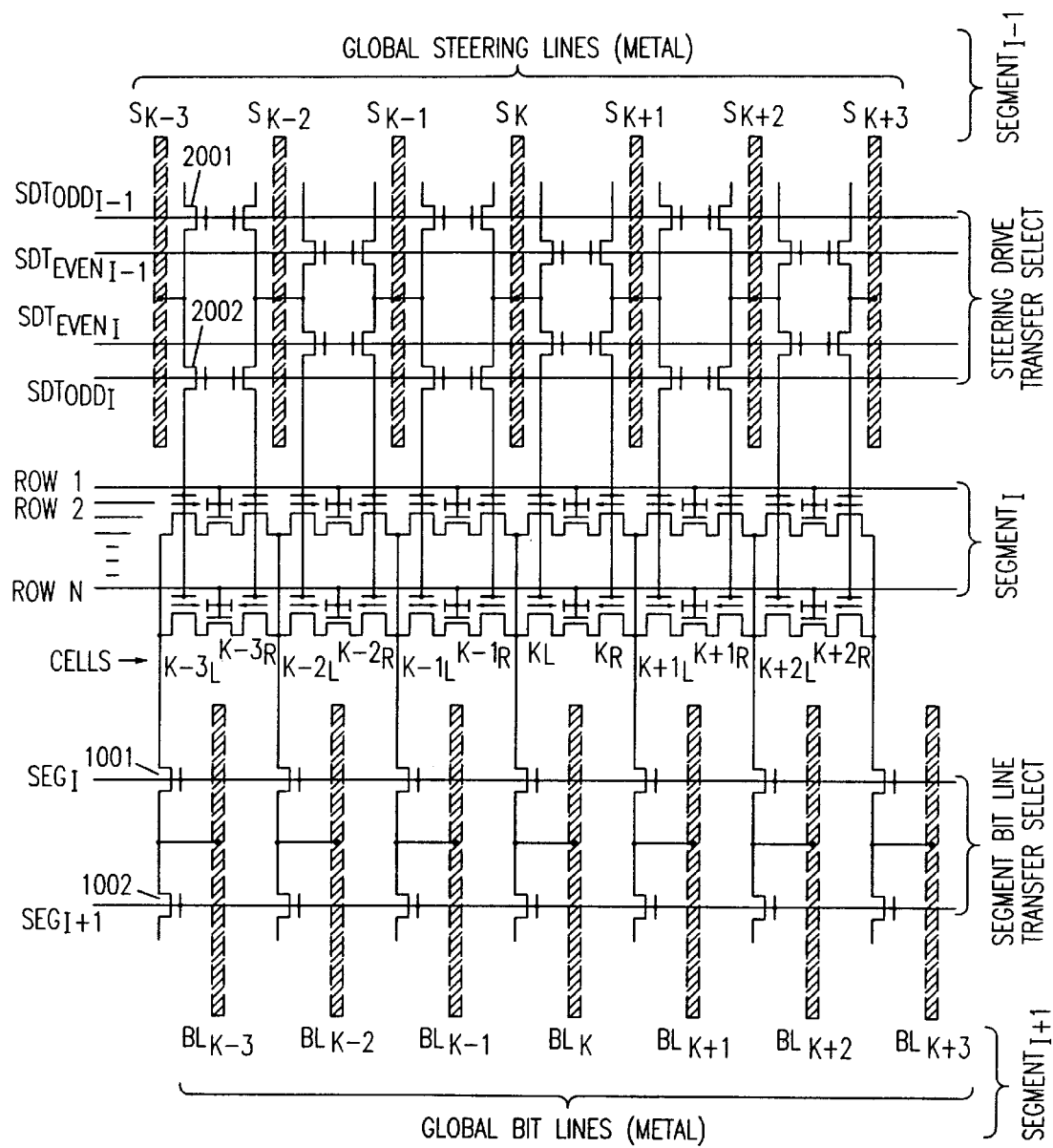
FIG. 10c is a circuit diagram depicting one embodiment of an array of cells as shown in FIG. 10b plus segment decode transistor matrix for both bit lines and steering lines.

FIG. 10c exemplifies such a segmentation embodiment, depicting one segment, denoted as SEGMENT I, consisting of N rows of cells (e.g. N equalling 32). For example, each row forms one sector consisting of 2048 dual gate cells or equivilantly 4096 floating gate storage elements. Alternatively, a sector can be formed by a group of two or more rows. The long, continuous, global bit lines (typically run in metal) BLk are selectively connected to the local segment subcolumns through the Segment Bit Line Transfer Select transistors 1001, 1002, driven by the SEGi lines. Similarly, the long, continuous global steering lines (typically run in metal) Sk are selectively connected to the local segment steering gates through the Steering Drive Transfer Select transistors 2001, 2002, driven by the STD_ODDi and STD_EVENi lines. In this way array segments are isolated from one another, eliminating the large cumulative parasitics of leakage and capacitance, and providing column associated defect and repetitive disturb confinement.

Performance can be increased by simultaneously operating on as many cells in one row as possible (where a row may have anywhere from 1K to 4K floating gate memory transistors), thereby maximizing parallelism. Peak power is not a limitation in such implementation, because of the low cell operating currents inherent to this cell approach both during read and programming operations. Consequently, the number of floating gate transistors per row which can be simultaneously operated on is limited only by addressing constraints and segment decode restrictions. For the embodiment shown in FIG. 10c, this allows every 4th floating gate to be addressed and operated on, simultaneously, as outlined in TABLE 5, allowing the full row to be addressed and operated on in four passes as follows.

During each pass, two adjacent diffusions are driven to drain potential followed by two adjacent diffusions driven to ground, with that bias pattern repeated across the entire row of cells. In this way global drain/source bias is applied in mirrored fashion to every other of the selected cells, resulting in floating gate bias conditions of odd selected cells being reversely applied to those of the even selected cells. Appropriate biases are placed on the global steering lines, as exemplified in TABLE 5, to satisfy the operation of the targeted floating gates as given in TABLE 4, while the local steering lines of the unselected cells are discharged and left isolated from the global steering lines. Once done, the bias conditions for both global bit/ground lines and targeted/untargeted floating gate steering lines are correspondingly interchanged to operate on the other of the floating gate pair within the selected cells. Once this is completed, similar operation is repeated to the alternate set (i.e. previously unselected set) of cells, thereby completing full row programming in four passes.

TABLE 5

| CELLS | | | | | | | GLOBAL BIT LINES | | | | | |
|---|---|---|---|---|---|---|---|---|---|---|---|---|
| K − 3L<br>K − 1R<br>K + 1L | K − 3R<br>K − 1L<br>K + 1R | K − 2L<br>KR<br>K + 2L | K − 2R<br>KL<br>K + 2R | | | | | | | | | |
| K + 3R | K + 3L | K + 4R | K + 4L | BLK − 3 | BLK − 2 | BLK − 1 | BLK | BLK + 1 | BLK + 2 | BLK + 3 | BLK + 4 |
| READ | | | | | | | | | | | |
| PASS 1 | SEL | UNSEL | UNSEL | UNSEL | 0 | 1.5 | 1.5 | 0 | 0 | 1.5 | 1.5 | 0 |
| PASS 2 | UNSEL | SEL | UNSEL | UNSEL | 1.5 | 0 | 0 | 1.5 | 1.5 | 0 | 0 | 1.5 |
| PASS 3 | UNSEL | UNSEL | SEL | UNSEL | 0 | 0 | 1.5 | 1.5 | 0 | 0 | 1.5 | 1.5 |
| PASS 4 | UNSEL | UNSEL | UNSEL | SEL | 1.5 | 1.5 | 0 | 0 | 1.5 | 1.5 | 0 | 0 |
| PROGRAM | | | | | | | | | | | |
| PASS 1 | SEL | UNSEL | UNSEL | UNSEL | 5 | 0 | 0 | 5 | 5 | 0 | 0 | 5 |
| PASS 2 | UNSEL | SEL | UNSEL | UNSEL | 0 | 5 | 5 | 0 | 0 | 5 | 5 | 0 |
| PASS 3 | UNSEL | UNSEL | SEL | UNSEL | 5 | 5 | 0 | 0 | 5 | 5 | 0 | 0 |
| PASS 4 | UNSEL | UNSEL | UNSEL | SEL | 0 | 0 | 5 | 5 | 0 | 0 | 5 | 5 |
| ERASE | SEL | SEL | SEL | SEL | 0 | 0 | 0 | 0 | 0 | 0 | 0 | 0 |

| CELLS | | | | | | | GLOBAL STEERING LINES | | | | | |
|---|---|---|---|---|---|---|---|---|---|---|---|---|
| K − 3L<br>K − 1R<br>K + 1L | K − 3R<br>K − 1L<br>K + 1R | K − 2L<br>KR<br>K + 2L | K − 2R<br>KL<br>K + 2R | | | | | | | | | |
| K + 3R | K + 3L | K + 4R | K + 4L | SK − 3 | SK − 2 | SK − 1 | SK | SK + 1 | SK + 2 | SK = 3 | SK + 4 |
| READ | | | | | | | | | | | |
| PASS 1 | SEL | UNSEL | UNSEL | UNSEL | VREFR | 8 | 8 | VREFR | VREFR | 8 | 8 | VREFR |
| PASS 2 | UNSEL | SEL | UNSEL | UNSEL | 8 | VREFR | VREFR | 8 | 8 | VREFR | VREFR | 8 |
| PASS 3 | UNSEL | UNSEL | SEL | UNSEL | VREFR | VREFR | 8 | 8 | VREFR | VREFR | 8 | 8 |
| PASS 4 | UNSEL | UNSEL | UNSEL | SEL | 8 | 8 | VREFR | VREFR | 8 | 8 | VREFR | VREFR |
| PROGRAM | | | | | | | | | | | |
| PASS 1 | SEL | UNSEL | UNSEL | UNSEL | VREFP | 12 | 12 | VREFP | VREFP | 12 | 12 | VREFP |
| PASS 2 | UNSEL | SEL | UNSEL | UNSEL | 12 | VREFP | VREFP | 12 | 12 | VREFP | VREFP | 12 |
| PASS 3 | UNSEL | UNSEL | SEL | UNSEL | VREFP | VREFP | 12 | 12 | VREFP | VREFP | 12 | 12 |
| PASS 4 | UNSEL | UNSEL | UNSEL | SEL | 12 | 12 | VREFP | VREFP | 12 | 12 | VREFP | VREFP |
| ERASE | SEL | SEL | SEL | SEL | 0 | 0 | 0 | 0 | 0 | 0 | 0 | 0 |

| CELLS | | | | SEGMENT _I LINES | | | ROW LINES SELECTED | |
|---|---|---|---|---|---|---|---|---|
| K − 3L | K − 3R | K − 2L | K − 2R | | | | | |
| K − 1R | K − 1L | KR | KL | | | | | |
| K + 1L<br>K + 3R | K + 1R<br>K + 3L | K + 2L<br>K + 4R | K + 2R<br>K + 4L | STD<br>EVEN_I | STD<br>ODD_I | SEG_I | ROW _J<br>LINE | UNSELECTED<br>ROWS |
| READ | | | | | | | | |
| PASS 1 | SEL | UNSEL | UNSEL | UNSEL | 0 | 10 | 5 | 1.5 | 0 |
| PASS 2 | UNSEL | SEL | UNSEL | UNSEL | 0 | 10 | 5 | 1.5 | 0 |
| PASS 3 | UNSEL | UNSEL | SEL | UNSEL | 10 | 0 | 5 | 1.5 | 0 |
| PASS 4 | UNSEL | UNSEL | UNSEL | SEL | 10 | 0 | 5 | 1.5 | 0 |
| PROGRAM | | | | | | | | |
| PASS 1 | SEL | UNSEL | UNSEL | UNSEL | 0 | 14 | 8 | 1.5 | 0 |
| PASS 2 | UNSEL | SEL | UNSEL | UNSEL | 0 | 14 | 8 | 1.5 | 0 |
| PASS 3 | UNSEL | UNSEL | SEL | UNSEL | 14 | 0 | 8 | 1.5 | 0 |
| PASS 4 | UNSEL | UNSEL | UNSEL | SEL | 14 | 0 | 8 | 1.5 | 0 |
| ERASE | SEL | SEL | SEL | SEL | 5 | 5 | 5 | <20 | 0 |

To give an idea of the high speed of this approach with respect to programming, assuming a physical row of 4096 floating gate elements, and 10 μsec per pass for cell programming, this gives an effective programming time of ~10 nsec/bit or a raw programming rate of 4096 bits per 40 μsec (i.e. per 4*10 μsec) or ~12.5 MBytes/sec.

In order to accommodate the negatively shifted steering in this embodiment, the steering segmentation transistor matrix is implemented in positively biased N well, P channel based circuitry.

As indicated above, in order to reduce maximum voltage levels required, it is desirable to keep the steering gate coupling ratio relatively high, for example, greater than approximately 60%, (see FIG. 10a for one embodiment of a cell equivalent circuit). In one embodiment, ONO interpoly2/1 dielectric (with, for example, an effective tox of 200 Å) is used, combined with a cell structure and process approach (described below), which reduces the parasitic substrate and interpoly3/1 capacitances.

Parasitic capacitances to substrate and drain are, in one embodiment, kept small by using a narrow channel structure, bounded by much thicker field oxide regions (such isolation structure is described in U.S. Pat. No. 5,343,063). By way of example, a cell with a narrow (for example, about $0.1\mu$ wide), approximately 300 Å thick gate oxide channel region bounded by about 1500 Å thick field regions, whose floating gates are laid out so as to substantially overlap those thick field regions (for example with a total overlap of about $0.3\mu$), would, in combination with the scaled ONO interpoly2/1, provide steering capacitance magnitudes of around five times larger than those of the floating gate to substrate/drain.

In order to reduce the interpoly3/1 capacitance, it must first be noted that in this dual floating gate Flash cell, poly3 crosses two edges of the poly1 floating gate, resulting in approximately double the interpoly3/1 capacitance of cells in which poly3 crosses only a single poly1 edge (for which parasitic coupling ratios are typically around 15%). Although the double edge structure may offer benefits to the erase tunneling element (e.g. voltage levels and distributions), its benefit is outweighed by the higher erasing and programming gate voltages needed to offset the associated poorer coupling efficiencies. Therefore, it is desirable to eliminate the capacitive impact of one of these two edges, even if in doing so its erase tunneling contribution is also eliminated. The following discussion describes one embodiment of a process to accomplish this, integrated into the self-aligned diffusion (BN+) formation process.

To realize a self-aligned BN+ cell, the BN+ sources/drains must be formed after the poly2/1 stack etch (i.e. self-aligned to poly2) thereby realizing the physically smallest cell. The challenge here is to remove the field oxide locally over the S/D region to allow BN+ As implant, while at the same time preserving sufficiently thick dielectrics surrounding the poly2 steering line for poly3 to poly2 high voltage isolation. The following section details the above mentioned exemplary process.

In looking at the twin cell in cross-section (see FIGS. 11a–11e for top view and various cross-sections, and in particular FIG. 11e), the process strategy to achieve both self-aligned BN+ formation and poly3/1 coupling reduction lies in the ability to separately process the two distinct regions, namely (1) the vertical strip regions associated with the BN+ and (2) the vertical strip containing the select channel portions. In so doing, the poly3/1 tunneling edge can be restricted to only form adjacent to the select strip, while completely eliminating its formation along the poly1 edge bordering the BN+ strip.

This is accomplished in the following manner (refer to FIG. 12a for cross-sections in row line direction, following some of the key process steps. NOTE: the poly3 row lines are defined here to run horizontally, and the BN+ columns to run vertically). By way of example, the following discussion includes representative numbers for dimensions and thicknesses, assuming a $0.25\mu$ technology (printing minimum lithographic feature size, both width and space, to achieve minimum pitch).

Figure 11A:
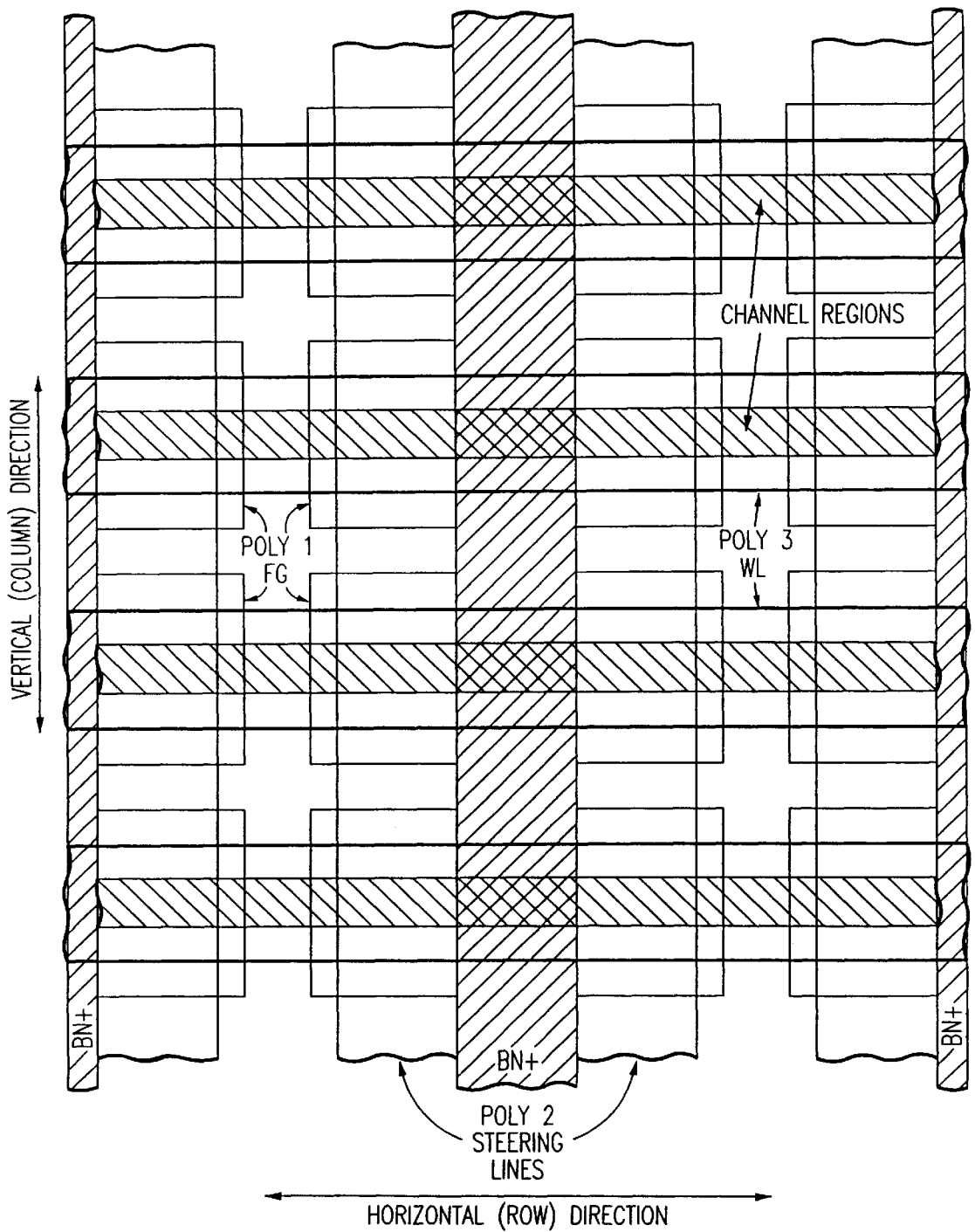
FIGS. 11a through 11e are detailed top and cross-sectional views.
Figure 11B:
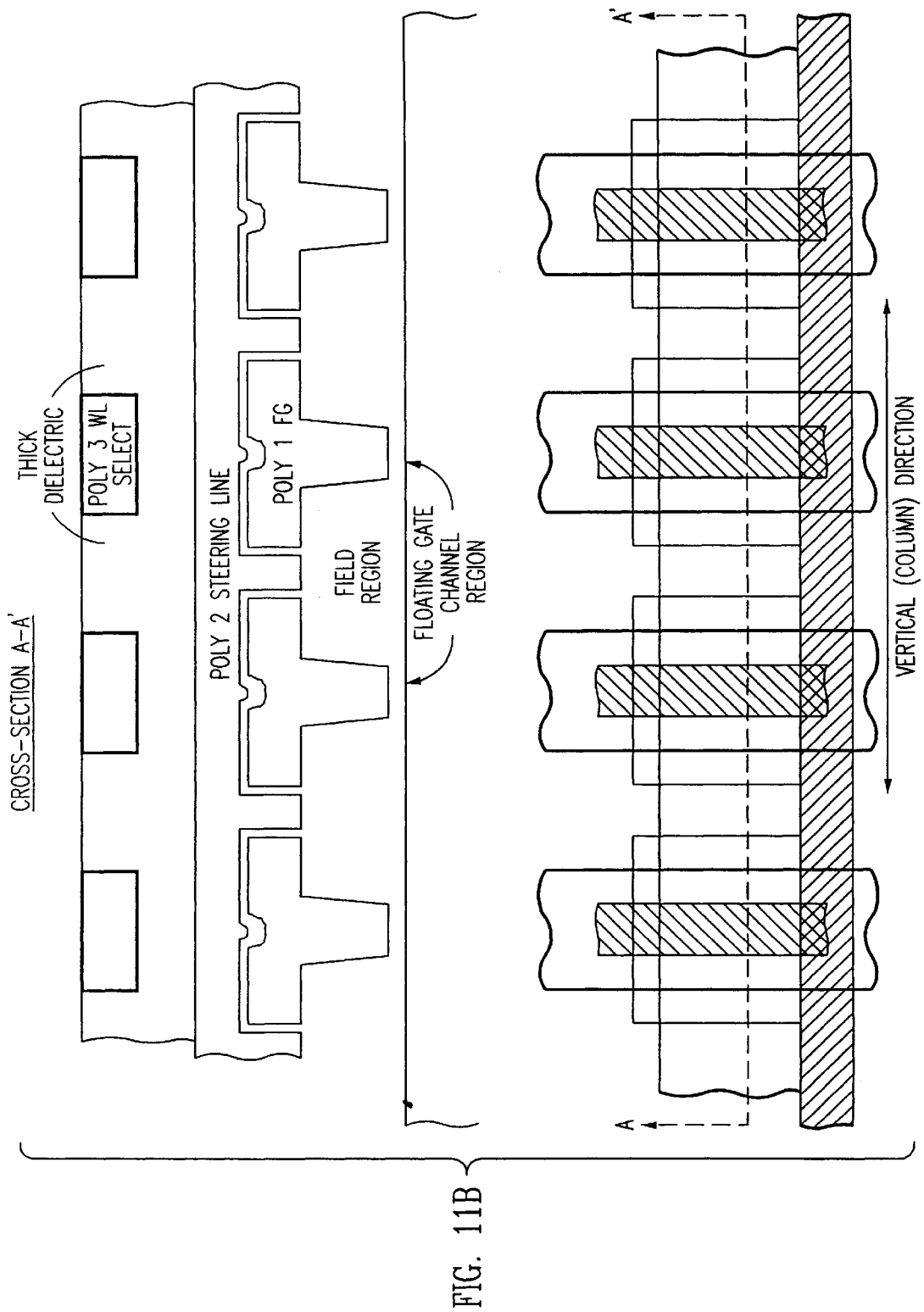
Figure 11C:
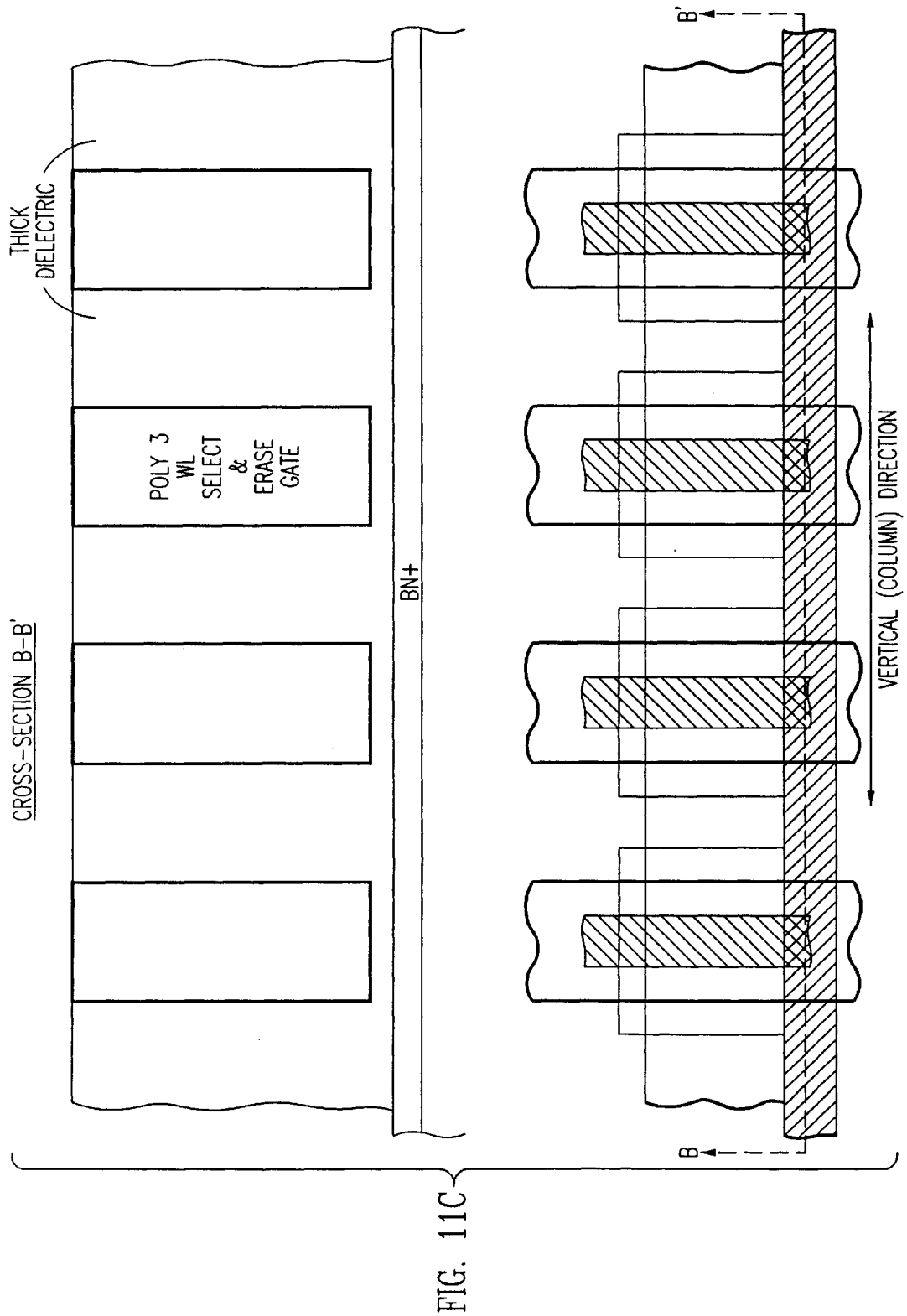
Figure 11D:
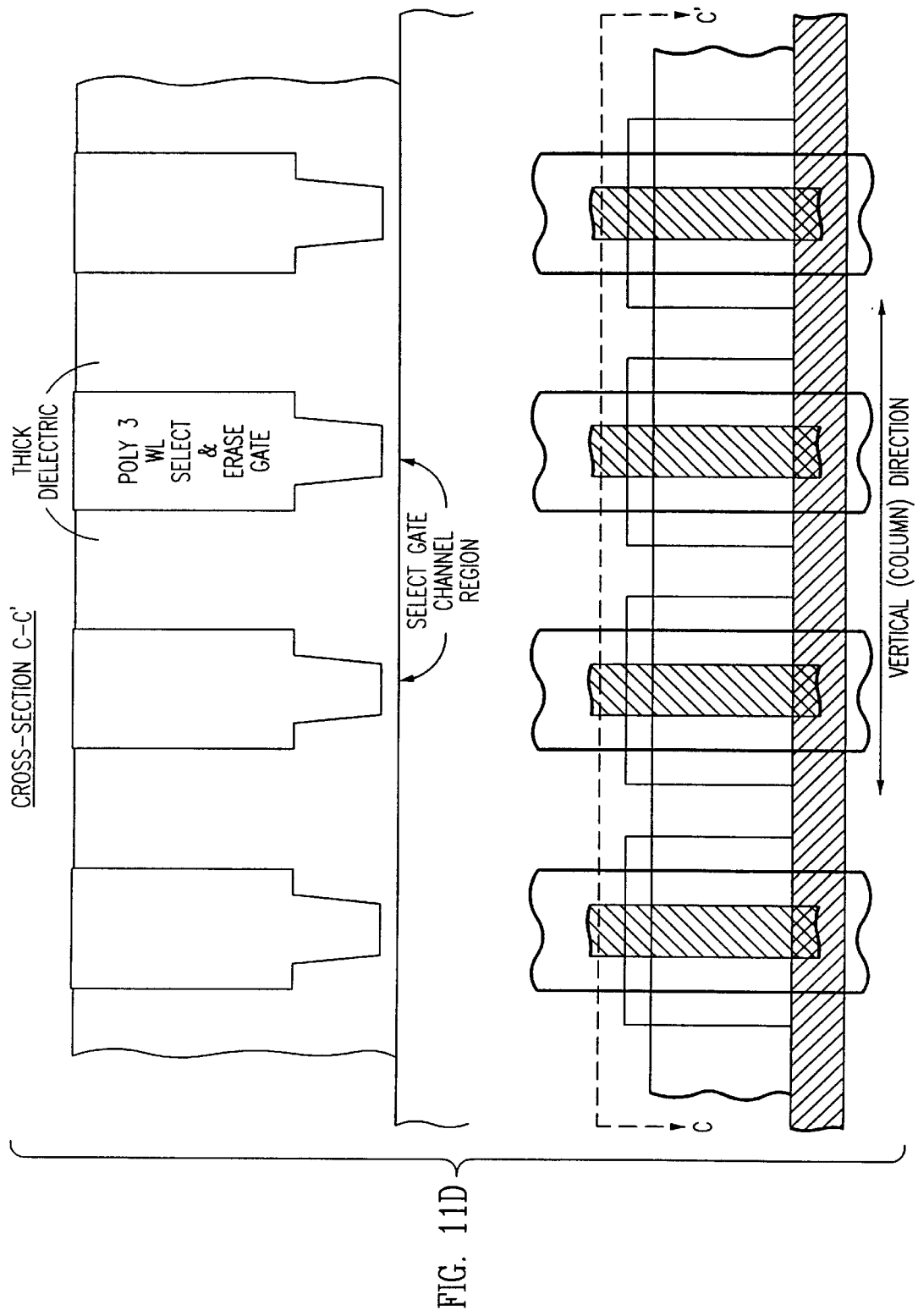
Figure 11E:
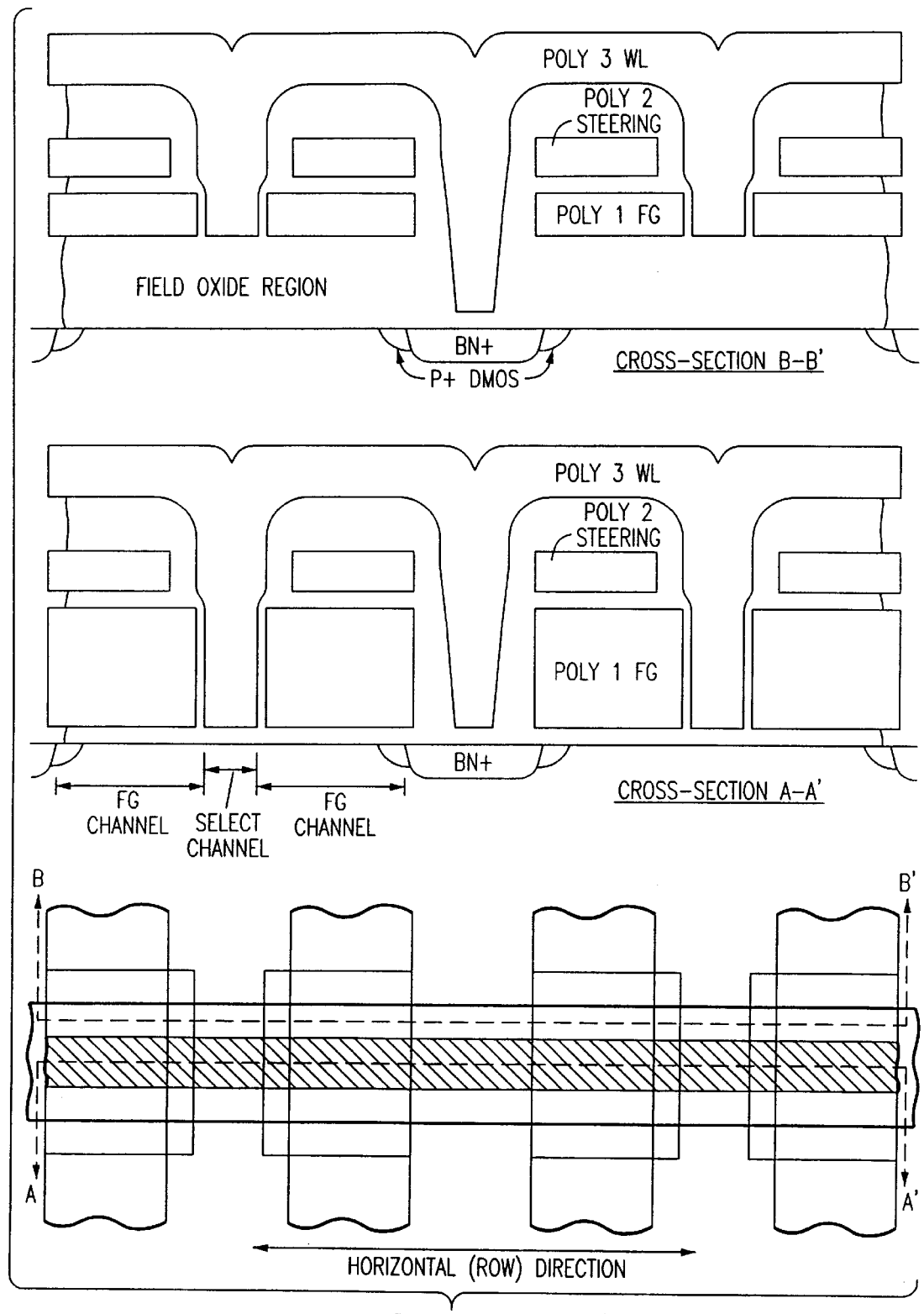

Form field oxide 1100 to a thickness of about 1500 Å, and etch it into horizontal strips, adding appropriate channel/field implants prior to or at this step. Use an oxide spacer approach to reduce channel width (for example, reduce from about $0.25\mu$ as etched to about $0.1\mu$ post spacer formation, thereby improving control gate coupling). Grow floating gate oxide 1101, (approximately 300 Å gate oxide). As shown in Sandisk U.S. Pat. No. 5,343,063, the fabrication steps up through the forming of poly1 1102 to a thickness of about 1500 Å are performed. Poly1 is then etched into horizontal strips overlying the channel regions plus generous overlap on the field region to either side of the channel. As with channel width, a spacer approach can be used to decrease the etched poly1 spacing, thereby increasing net poly1 overlap of field oxide, or "wings". For example, after the spacer step, poly1 spacing is reduced to about $0.1\mu$, giving poly1 wings of about $0.15\mu$ per side—refer to FIG. 11b showing a cross-section through the channel along the column direction for an example of poly1 wings over field oxide. Note that because of the narrow channel widths vis a vis the poly1 thickness, poly1 1102 will completely fill the trench, resulting in a substantially planar surface. Next form thin ONO 1103 (for example, having about 200 Å tox effective) on top of and along edges of the poly1 strips. In an alternative embodiment, a portion of the top film is formed as part of an initially deposited poly1 layer stack.

Figures 1, 12A:
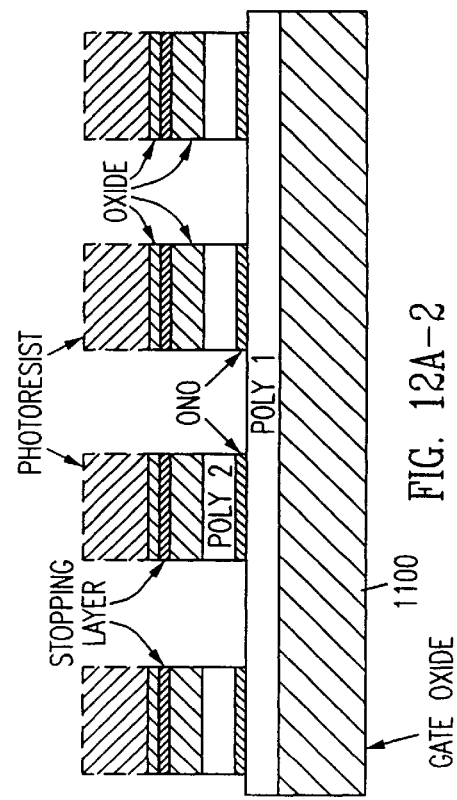
FIGS. 12a–12f are cross sectional views depicting fabrication steps suitable for use in fabricating multi-bit memory cells in accordance with this invention.
Figures 2, 12A:
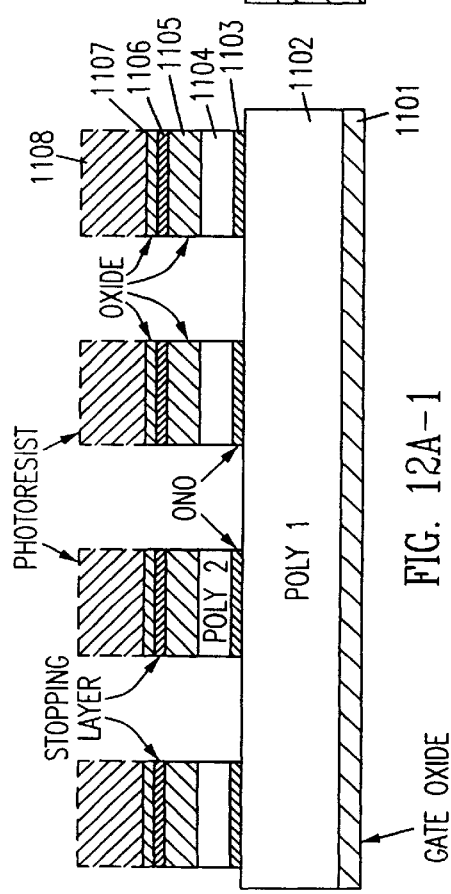

Referring to FIGS. 12a(i) and 12a(ii), deposit a sandwich layer of poly2 1104 (about 1500 Å), thick poly3/2 isolation oxide 1105 (approximately 2000 Å), plus a sufficiently thick etch stopping layer 1106 (to block underlying oxide removal when exposed to oxide type etch), and top oxide layer 1107. Using a patterned photoresist masking layer 1108, these are then etched in strips along the column direction, down to the poly1 layer, to form poly2 the steering gate lines. These exposed poly1 regions are overlying the areas to become select channel and BN+.

Figures 1, 12B:
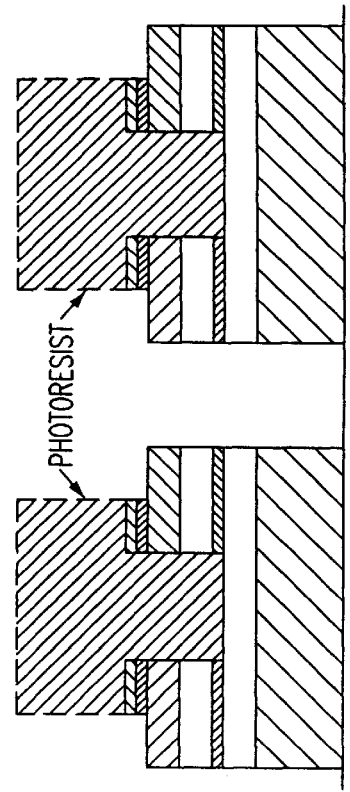
Figures 2, 12B:
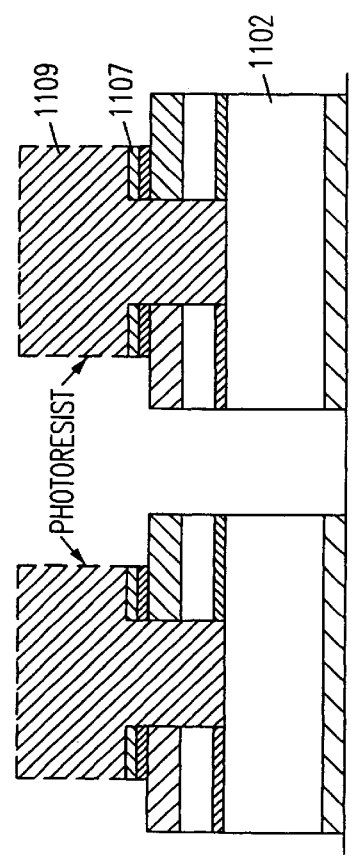

Referring to FIGS. 12b(i) and 12b(ii), strip previous photoresist and pattern new photoresist layer 1109 to cover and protect exposed poly1 over the select channel regions. Etch exposed poly1 1102 and all its underlying oxide 1101 which cover the to-be-formed BN+ regions. Oxide layer 1107 over etch stopping layer 1106 is used to protect etch stopping layer 1106 from being etched by the poly etch as poly1 1102 is being removed. Etch stopping layer 1106 (e.g. thin undoped polysilicon or possibly nitride—must have low etch rate compared to oxide etch rates) is used to prevent that portion of thick poly3/2 isolation oxide 1105 not covered by photoresist 1109 from being etched down as oxide 1101 beneath poly1 1102 is etched away. The oxide etch system used is both highly anisotropic (e.g. RIE) and selective vis a vis the underlying silicon substrate, resulting in negligible etching of that substrate, accommodating the large differences in oxide thicknesses being removed between field oxide (approximately 1500 Å) and gate oxide regions (approximately 300 Å). Following completion of all etching, photoresist 1109 is removed.

Figures 1, 12C:
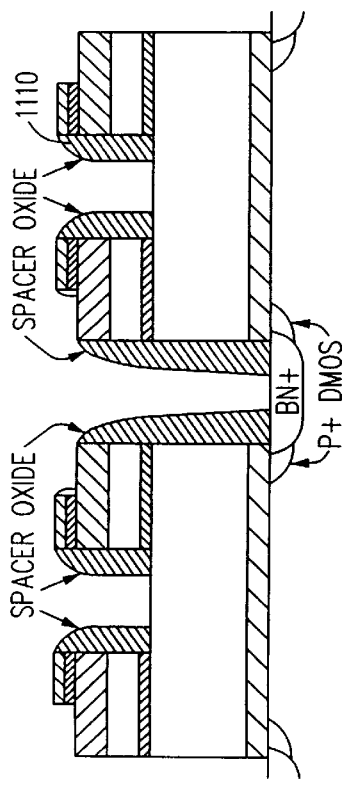
Figures 2, 12C:
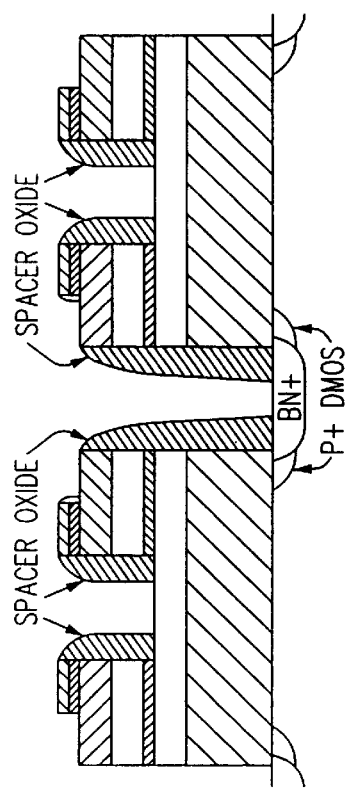

Referring to FIGS. 12c(i) and 12c(ii), at this point, an option is to implant and drive a sufficient Boron dose to form a p+ DMOS type doping profile adjacent to the BN+ junction (alternatively, this is the point at which the arsenic BN+ is implanted, but the resulting lateral diffusion makes the floating gate channel unnecessarily short). As shown in FIGS. 12c(i) and 12c(ii), oxide is formed and reactive ion etched back down to silicon to form sidewall spacers 1110 (about 750 Å thick, with the thickness here being determined by interpoly3/2 erase high voltage isolation requirements, for example, about 25v). The arsenic BN+ strips are then implanted.

Figures 1, 12D:
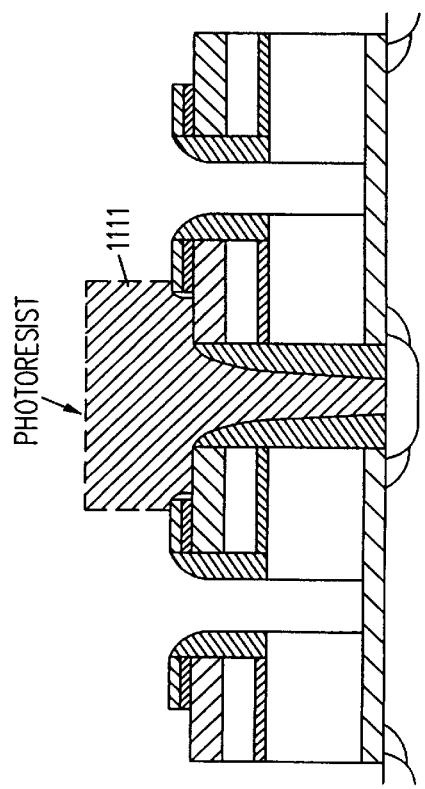
Figures 2, 12D:
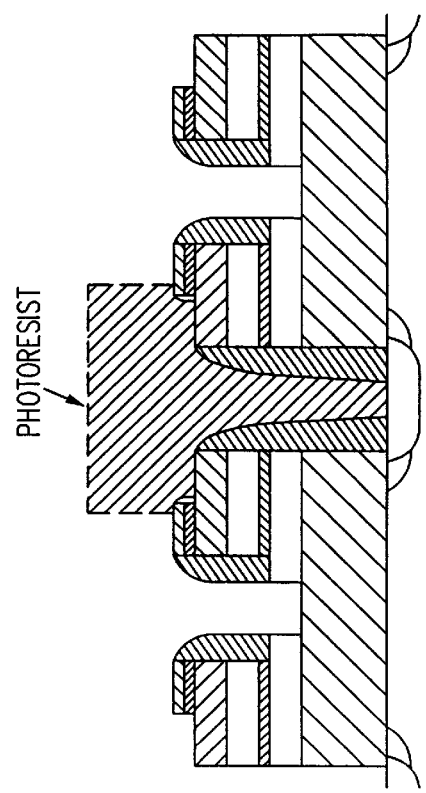

Referring to FIGS. 12d(i) and 12d(ii), a new patterned photoresist layer 1111 is added to cover and protect BN+ strips. The exposed poly1 over channel strips is etched, to expose the selected channel regions. (Since some of the poly1 overlies channel regions and is therefore thicker, while other portions overlie field oxide and is thinner, the same considerations for oxide etch selectivity apply as above, in the oxide over BN+ etching case.)

Figures 1, 12E:
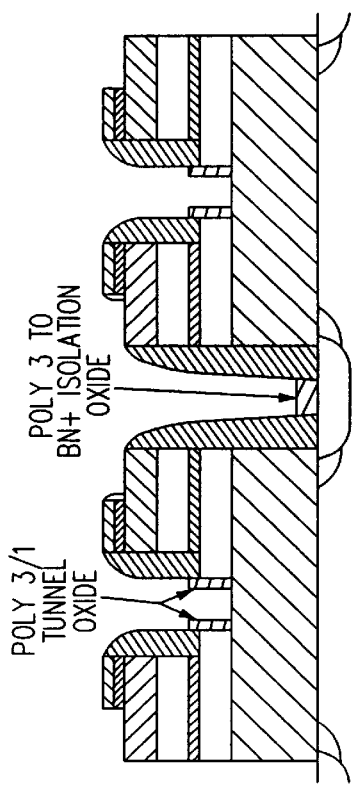

Referring to FIGS. 12e(i) and 12e(ii), once photoresist 1111 is stripped, oxide is formed (e.g. via thermal oxidation or some composite oxide) to simultaneously form the poly1 sidewall 1112 and corner interpoly3/1 tunneling oxides 1113 (for example, about 350 Å), the poly3 gate oxide 1114 over the select channel and oxide 1115 over BN+ (e.g. less than about 300 Å—the requirement for both of these oxides being they must be sufficiently thick to reliably hold up to the erase voltage to substrate differential). A select transistor threshold adjust implant can be optionally introduced at this time (e.g. increasing channel dopant concentration to raise select Vt, or introducing compensation implant to reduce select Vt).

Figures 1, 12F:
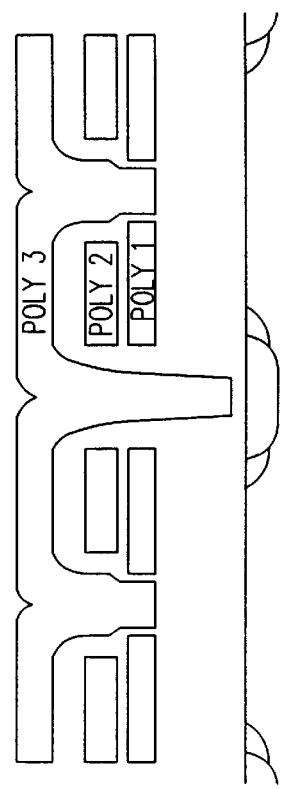
Figures 2, 12E:
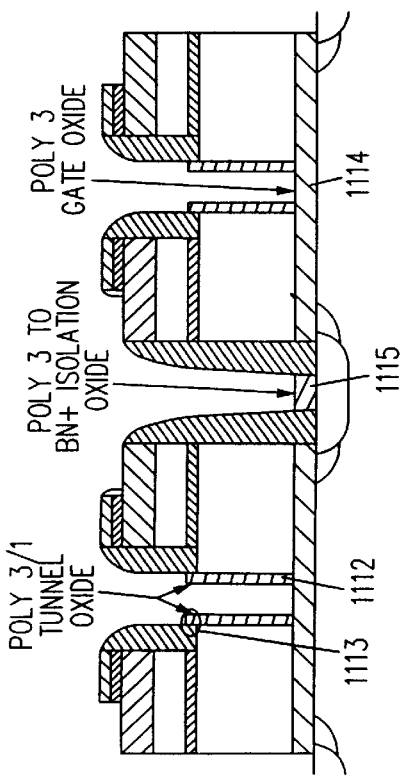
Figures 2, 12F:
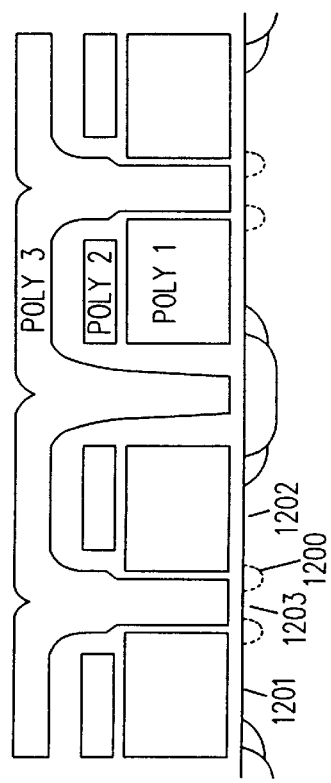

Referring to FIGS. 12f(i) and 12f(ii), after deposition and patterning of poly3 (which in one embodiment is polysilicide in order to reduce word line delay) the basic dual gate cell structure is complete. In one embodiment of this invention, a high electrical field region is enhanced in the channel far away from the reverse field region located in conventional devices near the drain and source regions. This is achieved, for example, by utilizing regions 1200 of increased doping concentration at the boundary between the channels 1201 and 1202 and transfer channel region 1203. In one embodiment, the width of region 1200 is on the order of 0.1 microns.

Using the above dimension and film thickness example values, the total floating gate capacitance becomes about 0.4 femtoFarads, and coupling ratios are approximately: Steering Gate (R21) 70%; Erase Gate 20%; Floating gate to Substrate & Drain 10%. Although this R21 value may vary from this figure somewhat in that fringing fields from the other terminals are not accounted for, this approximation indicates adequate coupling ratios are achieved in the dual gate cell, even under aggressive cell scaling.

A process variant of the above approach, which can reduce further still the erase coupling, is to completely fill the region over BN+ with an oxide, after BN+ formation. This is done, for example, by depositing a sufficiently thick, undensified (and hence easily etched away compared to underlying densified oxide films) oxide layer, patterning photoresist strips over the BN+ to protect it from etching, and etching away the exposed, undensified film over the select channel strips. Following this step and resist removal, the poly3/1 tunnel oxide process proceeds as outlined above, during which time the oxide filler over BN+ is densified.

The above approach and its variant outlines one of a number of possible ways to implement the above described dual floating gate cell into the desired array.

In summary, several concepts have been introduced to implementing the TWIN FG cell.

Fundamental to the cell is its low power source side programming mechanism, and low power row oriented poly-to-poly erase element. Additionally, its independent steering and selection functions, facilitates low power, multi-state read and programming operations.

ONO interpoly2/1 is readily integrated to provide a high capacitive coupling, ultra-low leakage steering element. One embodiment uses a full column segment confinement architecture to substantially reduce parasitic bit line capacitance and leakage.

A negatively shifted voltage steering implementation allows reduction of maximum voltage ceilings for both the poly2 steering lines during programming and the poly3 word/erase lines during erase. Under such implementation, one preferred embodiment for the column segmented array architecture is via an N-well isolated P channel steering selection matrix.

High steering ratio is achieved by the narrow channel plus field oxide approach to allow formation of wings. A preferred embodiment is described which reduces the interpoly3/1 parasitic as part of a self-aligned BN+ formation process. This replaces the thinner tunneling oxide adjacent one of the two potential tunneling edges with a much thicker isolation oxide. Based on the example used, this approach can give a cell with steering coupling ratio approaching 70%, and parasitic erase coupling down to 20%. Furthermore, based on that example, which uses a $0.25\mu$ technology for the 4*lambda$^2$ dual floating gate, poly3 word/erase line cell (where lambda is the minimum technology feature size), a physical cell area of 0.25 $\mu^2$ is realizable, which for 8 (16) level of multi-state translates to an effective cell size approaching ~0.08 $\mu^2$ (~0.06 $\mu^2$) per logical bit. These small sizes, around 100 times smaller than physical sizes of cells used in the 4 MEG and 8 MEG generation of Flash memories, are suitable for building Gigabit density level Flash memories with comparable die sizes and at comparable cost per die.

All publications and patent applications mentioned in this specification are herein incorporated by reference to the same extent as if each individual publication or patent application was specifically and individually indicated to be incorporated by reference.

The invention now being fully described, it will be apparent to one of ordinary skill in the art that many changes and modifications can be made thereto without departing from the spirit or scope of the appended claims.

What is claimed is:

1. A memory structure comprising:
   a source region of a first conductivity type;
   a drain region of said first conductivity type;
   a first channel region of a second conductivity type opposite said first conductivity type, located adjacent said source region;
   a second channel region of said second conductivity type opposite said first conductivity type, located adjacent said drain region;
   a transfer channel region of said second conductivity type, located between said first and second channel regions;
   a first floating gate located above said first channel region;
   a second floating gate located above said second channel region;
   a first control gate located above said first floating gate, serving as a steering element associated with said first floating gate;
   a second control gate located above said second floating gate, serving as a steering element associated with said second floating gate;
   a third control gate located above said transfer channel region, serving as a control gate of an access transistor, said third control gate also overlying at least a portion of said first and second control gates;
   a first tunneling zone formed between said first floating gate and said third control gate, and including one or more of edges, side wall, corners of the top edge, portions of the top, and portions of the bottom of said first floating gate; and
   a second tunneling zone formed between said second floating gate and said third control gate, and including one or more of edges, side wall, corners of the top edge, portions of the top, and portions of the bottom of said second floating gate.

2. A memory structure comprising:
   a source region of a first conductivity type;
   a drain region of said first conductivity type;

a first channel region of a second conductivity type opposite said first conductivity type, located adjacent said source region, a portion of said first channel region adjacent said source region being doped to said second conductivity type to a dopant concentration greater than that of said first channel region;

a second channel region of said second conductivity type opposite said first conductivity type, located adjacent said drain region, a portion of said second channel region adjacent said drain region being doped to said second conductivity type to a dopant concentration greater than that of said second channel region;

a transfer channel region of said second conductivity type, located between said first and second channel regions;

a first floating gate located above said first channel region;

a second floating gate located above said second channel region;

a first control gate located above said first floating gate, serving as a steering element associated with said first floating gate;

a second control gate located above said second floating gate, serving as a steering element associated with said second floating gate;

a third control gate located above said transfer channel region, serving as a control gate of an access transistor;

a first tunneling zone formed between said first floating gate and said third control gate, and including one or more of edges, side wall, corners of the top edge, portions of the top, and portions of the bottom of said first floating gate; and a second tunneling zone formed between said second floating gate and said third control gate, and including one or more of edges, side wall, corners of the top edge, portions of the top, and portions of the bottom of said second floating gate.

3. A memory structure comprising:

a source region of a first conductivity type;

a drain region of said first conductivity type;

a first channel region of a second conductivity type opposite said first conductivity type, located adjacent said source region;

a second channel region of said second conductivity type opposite said first conductivity type, located adjacent said drain region;

a transfer channel region of said second conductivity type, located between said first and second channel regions;

a first floating gate located above said first channel region;

a second floating gate located above said second channel region;

a first control gate located above said first floating gate, serving as a steering element associated with said first floating gate;

a second control gate located above said second floating gate, serving as a steering element associated with said second floating gate;

a third control gate located above said transfer channel region, serving as a control gate of an access transistor;

a first tunneling zone formed between said first floating gate and said third control gate, and including one or more of edges, side wall, corners of the top edge, portions of the top, and portions of the bottom of said first floating gate;

a second tunneling zone formed between said second floating gate and said third control gate, and including one or more of edges, side wall, corners of the top edge, portions of the top, and portions of the bottom of said second floating gate;

a first doped region at the interface of said first channel region and said transfer channel region, said first doped region being doped to said second conductivity type and having a greater dopant concentration than that of said first channel region and said transfer channel region; and a second doped region at the interface of said second channel region and said transfer channel region, said second doped region being doped to said second conductivity type and having a greater dopant concentration than that of said second channel region and said transfer channel region.

4. A memory array having a plurality of memory cells, comprising:

a plurality of diffused lines running in a first direction, serving as source and drain regions of said memory cells, each memory cell having a first channel region located adjacent said source region and a second channel region located adjacent said drain region, and a transfer channel region located between its said first and second channel regions;

a plurality of first floating gates, each located above said first channel region of an associated one of said memory cells;

a plurality of second floating gates, each located above said second channel region of an associated one of said memory cells;

a plurality of first control gate lines, running in said first direction, each located above an associated set of said first floating gates and serving as steering elements associated with each said first floating gate;

a plurality of second control gate lines, running in said first direction, each located above an associated set of said second floating gates and serving as steering elements associated with each said second floating gate; and a plurality of row lines, running in a second direction generally perpendicular to said first direction, forming a set of third control gates above said transfer channel regions of each memory cell, overlying at least a portion of associated ones of said first and second control gates and serving as control gates of access transistors of associated memory cells, wherein each of said memory cells is associated with the intersection of one of said diffused lines and one of said row lines, and wherein each memory cell includes a first tunnelling zone formed between said first floating gate and said third control gate, and including one or more of edges, side wall, corners of the top edge, portions of the top, and portions of the bottom of said first floating gate, and wherein each memory cell includes a second tunnelling zone formed between said second floating gate and said third control gate, and including one or more of edges, side wall, corners of the top edge, portions of the top, and portions of the bottom of said second floating gate.

5. A memory array having a plurality of memory cells, comprising:

a plurality of diffused lines running in a first direction, serving as source and drain regions of said memory cells, each memory cell having a first channel region located adjacent said source region, a portion of said first channel region adjacent said source region being doped to said second conductivity type to a dopant concentration greater than that of said first channel region and a second channel region located adjacent said drain region, a portion of said second channel region adjacent said drain region being doped to said second conductivity type to a dopant concentration greater than that of said second channel region, and a transfer channel region located between its said first and second channel regions;

a plurality of first floating gates, each located above said first channel region of an associated one of said memory cells;

a plurality of second floating gates, each located above said second channel region of an associated one of said memory cells;

a plurality of first control gate lines, running in said first direction, each located above an associated set of said first floating gates and serving as steering elements associated with each said first floating gate;

a plurality of second control gate lines, running in said first direction, each located above an associated set of said second floating gates and serving as steering elements associated with each said second floating gate; and a plurality of row lines, running in a second direction generally perpendicular to said first direction, forming a set of third control gates above said transfer channel regions of each memory cell, and serving as control gates of access transistors of associated memory cells, wherein each of said memory cells is associated with the intersection of one of said diffused lines and one of said row lines, and wherein each memory cell includes a first tunnelling zone formed between said first floating gate and said third control gate, and including one or more of edges, side wall, corners of the top edge, portions of the top, and portions of the bottom of said first floating gate, and wherein each memory cell includes a second tunnelling zone formed between said second floating gate and said third control gate, and including one or more of edges, side wall, corners of the top edge, portions of the top, and portions of the bottom of said second floating gate.

6. A memory array having a plurality of memory cells, comprising:

a plurality of diffused lines running in a first direction, serving as source and drain regions of said memory cells, each memory cell having a first channel region located adjacent said source region and a second channel region located adjacent said drain region, and a transfer channel region located between its said first and second channel regions;

a first doped region at the interface of each said first channel region and said transfer channel region, said first doped region being doped to said second conductivity type and having a greater dopant concentration than that of said first channel region and said transfer channel region;

a second doped region at the interface of each said second channel region and said transfer channel region, said second doped region being doped to said second conductivity type and having a greater dopant concentration than that of said second channel region and said transfer channel region a plurality of first floating gates, each located above said first channel region of an associated one of said memory cells;

a plurality of second floating gates, each located above said second channel region of an associated one of said memory cells;

a plurality of first control gate lines, running in said first direction, each located above an associated set of said first floating gates and serving as steering elements associated with each said first floating gate;

a plurality of second control gate lines, running in said first direction, each located above an associated set of said second floating gates and serving as steering elements associated with each said second floating gate; and a plurality of row lines, running in a second direction generally perpendicular to said first direction, forming a set of third control gates above said transfer channel regions of each memory cell, and serving as control gates of access transistors of associated memory cells, wherein each of said memory cells is associated with the intersection of one of said diffused lines and one of said row lines, and wherein each memory cell includes a first tunnelling zone formed between said first floating gate and said third control gate, and including one or more of edges, side wall, corners of the top edge, portions of the top, and portions of the bottom of said first floating gate, and wherein each memory cell includes a second tunnelling zone formed between said second floating gate and said third control gate, and including one or more of edges, side wall, corners of the top edge, portions of the top, and portions of the bottom of said second floating gate.

7. The memory structure as in claims 1, 2, 3, 4, 5, or 6 wherein said first conductivity type is N and said second conductivity type is P.

8. The memory structure as in claim 7 wherein said second conductivity type is provided by boron dopants.

9. The memory structure as in claims 1, 2, 3, 4, 5, or 6 wherein said floating gates comprise a first layer of polycrystalline silicon, said first control gates comprise a second layer of polycrystalline silicon, and said third control gate comprises a third layer of polycrystalline silicon.

10. The memory structure as in claims 1, 2, 3, 4, 5, or 6 which is capable of storing one of two logical states.

11. The memory array as in claim 10 wherein said floating gates establish one of a plurality of predetermined charge levels for storing one of two logical states.

12. The memory array as in claim 10 wherein said floating gates establish one of a plurality of predetermined charge levels for storing one of more than two logical states.

13. The memory structure as in claims 1, 2, 3, 4, 5, or 6 wherein said source region and said drain region comprise buried diffusions.

14. The memory structure as in claim 12 which further comprises a relatively thick dielectric layer overlying said buried diffusions.

15. The memory structure as in claims 1, 2, 3, 4, 5, or 6 wherein said transfer channel is doped to said second conductivity type to a doped concentration greater than that of said first and second channel regions.

16. The memory structure as in claims 1, 2, 3, 4, 5, or 6 wherein said transfer channel is counter doped to said second conductivity type to a net doped concentration less than that of said first and second channel regions.

17. The memory array as in claims 4, 5, or 6 organized into a plurality of sectors, each sector comprising one or more rows and organized such that erasure of all cells of a sector is performed simultaneously.

18. The memory array as in claims 4, 5, or 6 organized as a virtual ground array.

19. The memory array as in claims 4, 5, or 6 wherein said one of first or second floating gates in alternate cells in a given row are verified simultaneously.

20. The memory array as in claim 19 wherein an entire row is verified utilizing four verification operations.

21. The memory array as in claims 4, 5, or 6 wherein said one of first or second floating gates of alternate cells in a given row are programmed simultaneously by placing data associated with each memory cell to be programmed on its associated diffused lines.

22. The memory array as in claim 21 wherein an entire row is programmed utilizing four program operations.

23. A memory array comprising a plurality of sectors, each sector comprising:

a plurality of adjacent bit lines running in a first direction to form a corresponding plurality of columns;

a plurality of steering lines running in said first direction;

a plurality of word lines and their corresponding erase lines running in a second direction generally perpendicular to said first direction to form a corresponding plurality of rows; and a plurality of memory cells, each memory cell being associated with the intersection of one of said bit lines and one of said word lines, and each of said plurality of memory cells capable of being simultaneously erased.

24. The structure as in claim 23 wherein said word lines serve as said erase lines.

25. The structure as in claim 23 in which said memory cell is capable of storing one of two logical states.

26. The memory array as in claim 23 organized as a virtual ground array.

27. The memory array as in claim 23 which further comprises:

a plurality of diffused lines running in said first direction, serving as said bit lines and forming source and drain regions of said memory cells, each memory cell having a first channel region located adjacent said source region and a second channel region located adjacent said drain region, and a transfer channel region located between its said first and second channel regions;

a plurality of first floating gates, each located above said first channel region of an associated one of said memory cells;

a plurality of second floating gates, each located above said second channel region of an associated one of said memory cells;

a plurality of first control gate lines, running in said first direction, each located above an associated set of said first floating gates and serving as those of said steering lines associated with each said first floating gate;

a plurality of second control gate lines, running in said first direction, each located above an associated set of said second floating gates and serving as those of said steering lines associated with each said second floating gate; and a plurality of row lines serving as said word lines, running in said second direction generally perpendicular to said first direction, forming a set of third control gates above said transfer channel regions of each memory cell, overlying at least a portion of associated ones of said first and second control gates and serving as control gates of access transistors of associated memory cells, wherein each of said memory cells is associated with the intersection of one of said diffused lines and one of said row lines, and wherein each memory cell includes a first tunnelling zone formed between said first floating gate and said third control gate, and including one or more of edges, side wall, corners of the top edge, portions of the top, and portions of the bottom of said first floating gate, and wherein each memory cell includes a second tunnelling zone formed between said second floating gate and said third control gate, and including one or more of edges, side wall, corners of the top edge, portions of the top, and portions of the bottom of said second floating gate.

28. The memory array as in claim 27 wherein said one of first or second floating gates in alternate cells in a given row are verified simultaneously.

29. The memory array as in claim 28 wherein an entire row is verified utilizing four verification operations.

30. The memory array as in claim 27 wherein alternate cells in a given row are programmed simultaneously by placing data associated with each memory cell to be programmed on its associated bit line.

31. The memory array as in claim 30 wherein an entire row is programmed utilizing four program operations.

32. The structure as in claims 1, 2, 3, 4, 5, 6, or 23 which further comprises steering bias circuitry capable of providing steering bias voltage levels less than zero.

33. The structure as in claim 23 in which said memory cell is capable of storing one of more than two logical states.

34. The memory structure as in claims 1, 2, 3, 4, 5, or 6 which is capable of storing one of more than two logical states.

* * * * *